United States Patent
Glass et al.

(10) Patent No.: US 10,944,006 B2
(45) Date of Patent: Mar. 9, 2021

(54) GEOMETRY TUNING OF FIN BASED TRANSISTOR

(71) Applicant: Intel Corporation, Santa Clara, CA (US)

(72) Inventors: Glenn A. Glass, Portland, OR (US); Anand S. Murthy, Portland, OR (US); Karthik Jambunathan, Portland, OR (US); Chandra S. Mohapatra, Hillsboro, OR (US); Hei Kam, Hillsboro, OR (US); Nabil G. Mistkawi, Keizer, OR (US); Jun Sung Kang, Hillsboro, OR (US); Biswajeet Guha, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 109 days.

(21) Appl. No.: 16/070,262

(22) PCT Filed: Mar. 30, 2016

(86) PCT No.: PCT/US2016/025070
§ 371 (c)(1),
(2) Date: Jul. 13, 2018

(87) PCT Pub. No.: WO2017/171759
PCT Pub. Date: Oct. 5, 2017

(65) Prior Publication Data
US 2019/0019891 A1    Jan. 17, 2019

(51) Int. Cl.
*H01L 21/308*    (2006.01)
*H01L 29/78*    (2006.01)
(Continued)

(52) U.S. Cl.
CPC .......... *H01L 29/7851* (2013.01); *B82Y 10/00* (2013.01); *H01L 21/3081* (2013.01); *H01L 21/823821* (2013.01); *H01L 29/0673* (2013.01); *H01L 29/0847* (2013.01); *H01L 29/1037* (2013.01); *H01L 29/4232* (2013.01);
(Continued)

(58) Field of Classification Search
CPC ............ H01L 29/7851; H01L 21/3081; H01L 21/823821
See application file for complete search history.

(56) References Cited

U.S. PATENT DOCUMENTS

2010/0048027 A1    2/2010    Cheng et al.
2013/0200483 A1    8/2013    Tung
(Continued)

FOREIGN PATENT DOCUMENTS

KR    10-2015-0116568    10/2015

OTHER PUBLICATIONS

International Preliminary Report on Patentability for International Patent Application No. PCT/US2016/025070, dated Oct. 11, 2018, 10 pages.
(Continued)

*Primary Examiner* — Elias Ullah
(74) *Attorney, Agent, or Firm* — Schwabe, Williamson & Wyatt, P.C.

(57) ABSTRACT

A trench is formed in an insulating layer to expose a native fin on a substrate. A replacement fin is deposited on the native fin in the trench. The replacement fin is trimmed laterally.

21 Claims, 13 Drawing Sheets

(51) Int. Cl.
*H01L 21/8238* (2006.01)
*H01L 29/06* (2006.01)
*H01L 29/66* (2006.01)
*H01L 29/10* (2006.01)
*H01L 29/775* (2006.01)
*B82Y 10/00* (2011.01)
*H01L 29/08* (2006.01)
*H01L 29/423* (2006.01)
H01L 27/092 (2006.01)
H01L 21/8258 (2006.01)

(52) U.S. Cl.
CPC .... *H01L 29/6681* (2013.01); *H01L 29/66439* (2013.01); *H01L 29/66545* (2013.01); *H01L 29/66818* (2013.01); *H01L 29/775* (2013.01); *H01L 29/78* (2013.01); H01L 21/8258 (2013.01); H01L 21/823807 (2013.01); H01L 27/0924 (2013.01); H01L 29/0669 (2013.01)

(56) References Cited

U.S. PATENT DOCUMENTS

| | | |
|---|---|---|
| 2014/0353801 A1 | 12/2014 | Jacob et al. |
| 2015/0064854 A1 | 3/2015 | Leobandung |
| 2018/0197789 A1* | 7/2018 | Glass .............. H01L 21/823807 |

OTHER PUBLICATIONS

International Search Report and Written Opinion for International Patent Application No. PCT/US2016/025070 dated Dec. 26, 2016, 13 pgs.

\* cited by examiner

GEOMETRY TUNING OF FIN BASED TRANSISTOR

CROSS-REFERENCE TO RELATED APPLICATION

This patent application is a U.S. National Phase Application under 35 U.S.C. § 371 of International Application No. PCT/US2016/025070, filed Mar. 30, 2016, entitled "GEOMETRY TUNING OF FIN BASED TRANSISTOR," which designates the United States of America, the entire disclosure of which is hereby incorporated by reference in its entirety and for all purposes.

TECHNICAL FIELD

Embodiments as described herein relate to the field of electronic systems manufacturing, and in particular, to manufacturing fin-based electronic devices.

BACKGROUND ART

Generally, in a fin-based transistor, the channel is surrounded by several gates on multiple surfaces that increase electrical control over the channel. This provides better suppression of "off-state" leakage current and increases the drive current in the "on" state comparing to conventional planar transistors that translate to lower power consumption and enhanced device performance.

In modern integrated circuits silicon is typically used to build transistors. Silicon, however, has some limitations that may affect the device performance. For example, the mobilities of electrons and holes in silicon have limitations that present a barrier to increasing the device performance. Additionally, the electrical characteristics of silicon transistors degrade as temperature increases.

One possible method, to increase the electron mobility for an n-type metal-oxide-semiconductor (MOS) transistor is to employ a group III-V element compound material grown on silicon to replace a silicon channel. To increase the hole mobility for a p-type MOS transistor methods may include employing a germanium (Ge) or a silicon germanium (SiGe) material grown on silicon to replace a silicon channel.

Differences in atomic lattice constants and thermal expansion coefficients between the replacement material and silicon, however, cause detrimental defects to form when the replacement material is grown on silicon. Conventional techniques of depositing the replacement material on silicon lead to worse electrostatics as measured by high subthreshold swing and source to drain leakage current while in the off state.

DESCRIPTION OF THE EMBODIMENTS

Figure 1:
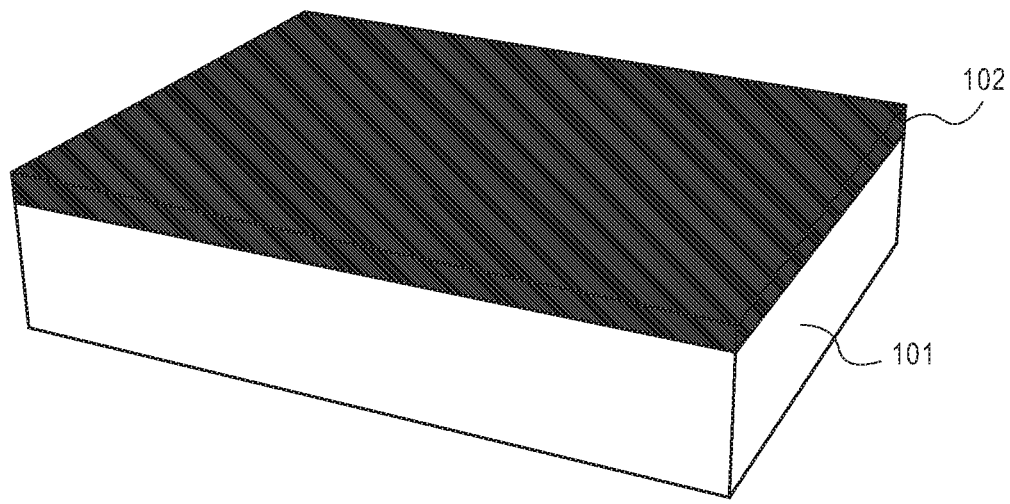
FIG. 1 shows a perspective view of a portion of an electronic device structure according to one embodiment.

Methods and apparatuses to provide geometry tuning of a fin-based transistor are described. A trench is formed in an insulating layer to expose a native fin on a substrate. A replacement fin is deposited on the native fin in the trench. The replacement fin trimmed laterally using a first chemistry.

In one embodiment, co-integration of group III-V element compound materials for a n-MOS channel and Ge/SiGe materials for a p-MOS channel is considered as replacement for silicon complementary metal oxide semiconductor (CMOS) channels. The hole mobility in a SiGe FinFET can be further increased by introducing compressive stress by growing the SiGe channel epitaxially on top of silicon in shallow trench isolation (STI) structures on a (001) silicon wafer. The SiGe fin width can be equal or narrower than 10 nanometers (nm).

In one embodiment, forming replacement fins involves etching trenches into a substrate to form native fins, filling the trenches adjacent to the native fins with an insulating material and etching out the native fins to leave fin-shaped regions that can be filled. Typically, the fins formed by etching the trenches into the substrate are so-called native because they are composed of native substrate material. A replacement material (e.g., a III-V, Ge, SiGe) layer that fills the trenches exerts a lateral force on the surrounding STI material that results in the replacement fin being wider than the original trench width. The fattening of the replacement fin may be increased by trench cleans or etches that consume the STI material surrounding the fin-shaped opening. In one embodiment, anisotropic wet or dry etch chemistries are used to trim the replacement fin laterally so that the replacement fin is equal in width or narrower than the underlying silicon fin. In one embodiment, an etching process (e.g., wet etch, dry etch, or both) is optimized to etch replacement channel fill fins laterally to provide a desired fin width that is equal to or narrower than the width of the underlying silicon fin. This is particularly useful for non-planar fin based transistors (e.g., tri-gate, all around gate, or other non-planar transistors) having the diffusion lines defined by the fins that are much narrower than the equivalent process nodes for planar transistors. In one embodiment, the native fin width that defines the width of the fin based transistors described herein is less than 30 nm. In one embodiment, the replacement fin is substantially defect-free as-deposited. In this case, the shape of the deposition has no trapping effect on crystalline defects because the replacement films may be free of such dislocation defects.

In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without specific details. In other instances, well-known features are omitted or simplified in order not to obscure the illustrative implementations.

Various operations will be described as multiple discrete operations, in turn, in a manner that is most helpful in understanding the present invention; however, the order of description should not be construed to imply that these operations are necessarily order dependent. In particular, these operations need not be performed in the order of presentation.

While certain example embodiments are described and shown in the accompanying drawings, it is to be understood that such embodiments are merely illustrative and not restrictive, and that the embodiments are not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in at least one embodiment. Thus, the appearance of the phrases, such as "one embodiment" and "an embodiment" in various places throughout the specification are not necessarily all referring to the same embodiment. Furthermore, the particular features, structures, or characteristics may be combined in any suitable manner in one or more embodiments.

Moreover, inventive aspects lie in less than all the features of a single disclosed embodiment. Thus, the claims following the Detailed Description are hereby expressly incorporated into this Detailed Description, with each claim standing on its own as a separate embodiment. While the example embodiments have been described herein, those skilled in the art will recognize that these example embodiments can be practiced with modification and alteration as described herein. The description is thus to be regarded as illustrative rather than limiting.

FIG. 1 shows a perspective view 100 of a portion of an electronic device structure according to one embodiment. The electronic device structure comprises a substrate 101. In an embodiment, the substrate 101 includes a semiconductor material, e.g., monocrystalline silicon ("Si"), germanium ("Ge"), silicon germanium ("SiGe"), a III-V materials based material e.g., indium-gallium arsenide ("InGaAs"), or any combination thereof.

In an embodiment, the substrate 101 is a substrate having aligned along a predetermined crystal orientation. Generally, the crystallographic orientations (e.g., (100), (111), (110), and other crystallographic orientations) are known to one of ordinary skill in the art of microelectronic device manufacturing.

In an embodiment, substrate 101 is a semiconductor-on-isolator (SOI) substrate including a bulk lower substrate, a middle insulation layer, and a top monocrystalline layer aligned along a predetermined crystal orientation, for example, <100> crystal orientation. The top monocrystalline layer may comprise any material listed above, e.g., silicon. In an embodiment, substrate 101 is a silicon substrate.

A hard mask layer 102 is deposited on the substrate 101, as shown in FIG. 1. In one embodiment, the hard mask layer can be deposited and patterned using one of hard mask deposition and patterning techniques known to one of ordinary skill in the art of microelectronic device manufacturing. In at least some embodiments, hard mask layer 102 comprises an aluminum oxide (e.g., Al2O3); polysilicon, amorphous silicon, silicon nitride, silicon oxynitride, silicon carbide or stacks of multiple layers, or other hard mask layers. In alternative embodiments, hard mask layer 102 is an oxide hard mask, a nitride hard mask, a silicon carbide hard mask, or any other hard mask known to one of ordinary skill in the art of microelectronic device manufacturing.

Figure 2:
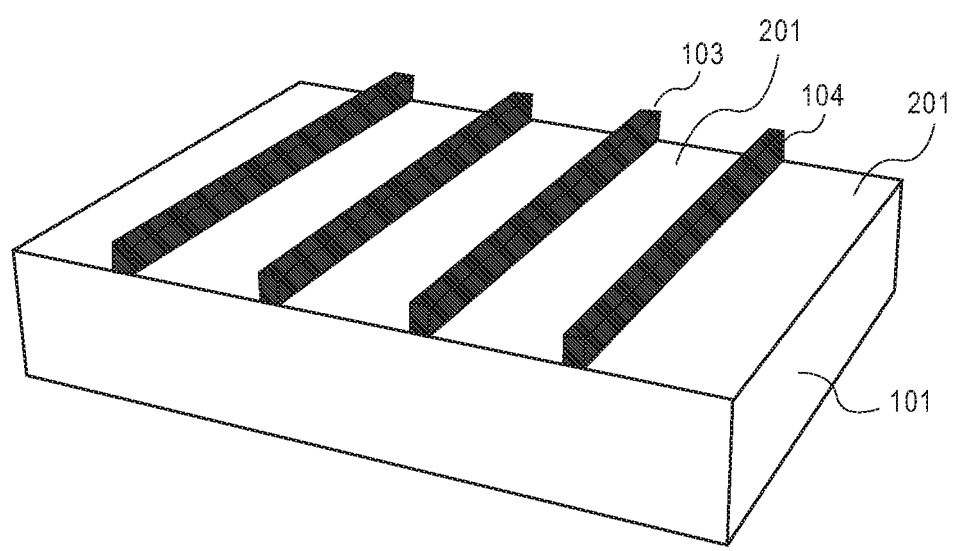
FIG. 2 is a view similar to FIG. 1, after the portions of the patterned hard mask layer are removed according to one embodiment.
Figure 3:
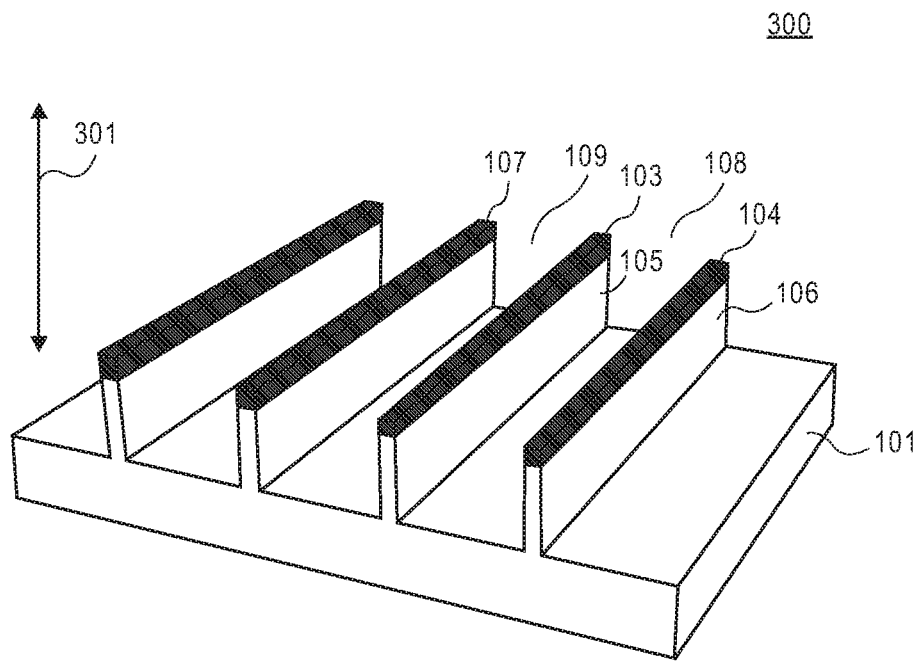
FIG. 3 is a view similar to FIG. 2 after trenches are formed in substrate according to one embodiment.

FIG. 2 is a view 200 similar to FIG. 1, after the portions of the patterned hard mask layer 102 are removed to expose portions of substrate 101 according to one embodiment. As shown in FIG. 2, the portions of the patterned hard mask layer 102 are removed to expose portions 201 of the substrate 101. In one embodiment, the portions of the patterned hard mask layer 102 are removed using one or more etching techniques known to one of ordinary skill in the art of microelectronic device manufacturing. The patterned hard mask has a plurality of hard mask features, e.g., a hard mask feature 103 and a hard mask feature 104. In one embodiment, hard mask features 103 and 104 are stripes that extend along the top surface of the substrate 101 and are separated from one another by a distance. In other embodiments, mask features 103 and 104 have other shapes determined by design. FIG. 3 is a view 300 similar to FIG. 2 after trenches are formed in substrate 101 according to one embodiment. A plurality of trenches, such as a trench 108 and a trench 109 are formed on substrate 101 through the patterned hard mask layer 102 to define native fins, such as a native fin 105 and a native fin 106. These fins are so-called native because they are composed of native substrate material. In one embodiment, trench 108 and trench 109 are shallow trench recesses. In one embodiment, forming the trenches 108 and 109 involves etching the portions of the substrate 101 exposed by the patterned hard mask features 103 and 104 substantially along a vertical axis 301. Vertical axis 301 is substantially orthogonal to a top plane of substrate 101, as shown in FIG. 3. The portions of the substrate 101 underneath the hard mask features are left substantially intact by etching so that native fins, such as a native fin 105 and a native fin 106 are formed. As shown in FIG. 3, each of the native fins 105 and 106 extends from the top surface of the substrate 101 along vertical axis 301. In at least some embodiments, each of the native fins 105 and 106 is a silicon fin, or any other material fin.

In at least some embodiments, the portions of the substrate 101 exposed by the patterned hard mask features are removed using one or more etching techniques known to one of ordinary skill in the art of microelectronic device manufacturing, such as but not limited to dry etching. In at least some embodiments, the portions of the substrate 101 exposed by the patterned hard mask features are removed using an anisotropic etching technique known to one of ordinary skill in the art of microelectronic device manufacturing.

Figure 4:
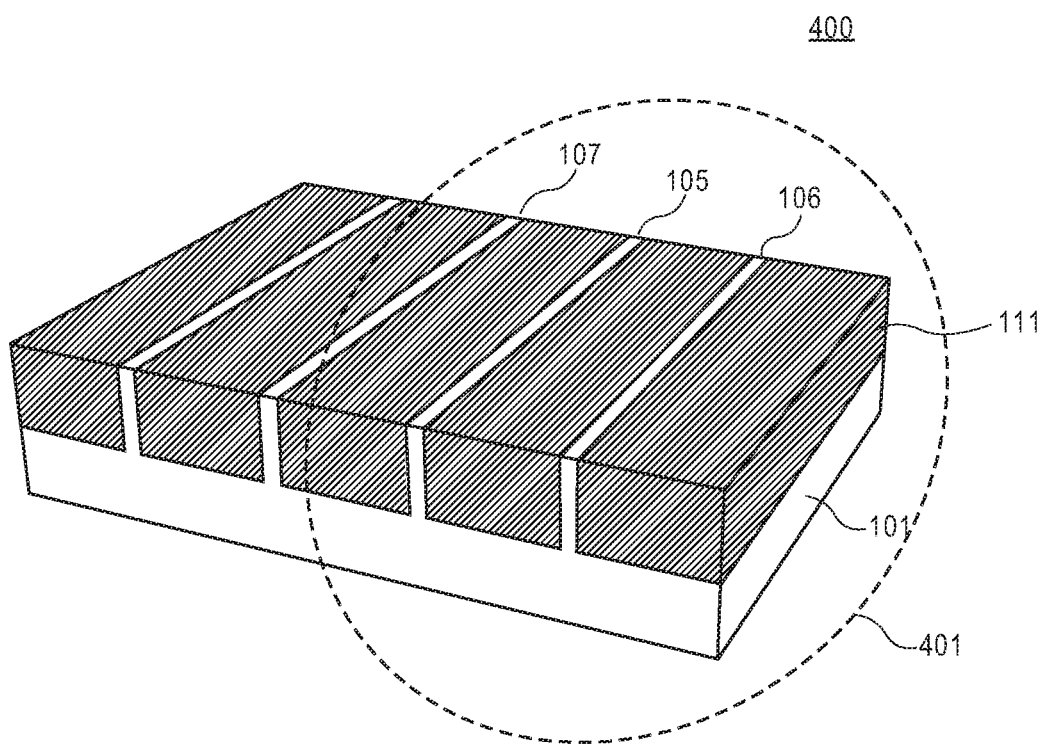
FIG. 4 is a view similar to FIG. 3 after an insulating layer is deposited into the trenches on the substrate and planarized according to one embodiment.

FIG. 4 is a view 400 similar to FIG. 3 after an insulating layer 111 is deposited into the trenches on the substrate and planarized according to one embodiment. As shown in FIG. 4, insulating layer 111 is deposited on the sidewalls of the native fins 105 and 106 and on the exposed portions of the substrate 101 filling the trenches 108 and 109. As shown in FIG. 4, the insulating layer 111 and the patterned hard mask features 103 and 104 are removed from the top portions of the native fins 105 and 106. In one embodiment, the insulating layer and the patterned hard mask features are removed using a polishing process, e.g., a chemical-mechanical planarization ("CMP") process known to one of ordinary skill in the art of microelectronic device manufacturing.

The insulating layer 111 can be any material suitable to electrically insulate adjacent devices and prevent leakage. In one embodiment, insulating layer 111 is a shallow trench isolation (STI) layer to provide field isolation regions that isolate one device from other devices on substrate 101. In one embodiment, insulating layer 111 is an oxide layer, e.g., a silicon oxide, an aluminum oxide layer, a nitride layer, e.g., a silicon nitride, a silicon oxide nitride, other oxide/nitride layer, any other electrically insulating layer determined by an electronic device design, or any combination thereof. In one embodiment, insulating layer 111 comprises an interlayer dielectric (ILD), e.g., silicon dioxide. In one embodiment, insulating layer 111 may include polyimide, epoxy, photodefinable materials, such as benzocyclobutene (BCB), and WPR-series materials, or spin-on-glass. In one embodiment, insulating layer 111 is a low permittivity (low-k) ILD layer. Typically, low-k is referred to the dielectrics having dielectric constant (k) lower than that of silicon dioxide.

In one embodiment, insulating layer 111 is blanket deposited using one or more deposition techniques, such as but not limited to a chemical vapor deposition (CVD), a physical vapor deposition (PVD), molecular beam epitaxy ("MBE"), metalorganic chemical vapor deposition ("MOCVD"), atomic layer deposition ("ALD"), or other insulating layer deposition technique known to one of ordinary skill in the art of microelectronic device manufacturing.

Figure 5:
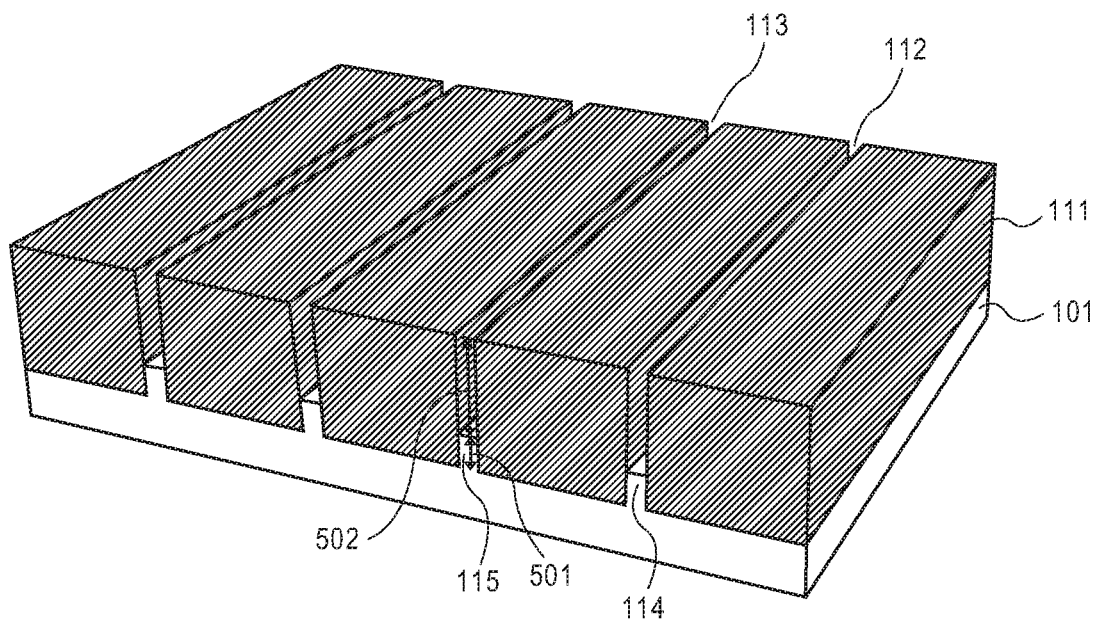
FIG. 5 is a view similar to FIG. 4 after the native fins are recessed according to one embodiment.

FIG. 5 is a view 500 similar to FIG. 4 after the native fins are recessed according to one embodiment. As shown in FIG. 5, native fins 105 and 106 are recessed to a predetermined depth 502 to form recessed fins 115 and 114 within openings 112 and 113. The remainder of the native fin height 501 is a passive element in the device. The depth 502 is the native fin removal depth that defines the height of the replacement material deposited thereon later in a process. In one non-limiting embodiment, depth 502 is from about 20 nm to about 80 nm, or any other height. As shown in FIG. 5, the shape of the openings 112 and 113 is defined by the shape of the native fins 105 and 106 respectively. In one embodiment, the openings 112 are and 113 are slots having the length substantially greater than the width.

As shown in FIG. 5, the top portions of the recessed native fins 115 and 114 act as bottom portions of the openings 112 and 113. The native fins 105 and 106 are recessed to provide a non-ion damaged interface with a replacement fin deposited thereon later on in a process.

In one embodiment, the native fins 104 and 105 are etched out selectively to insulating layer 111 for a predetermined time using one or more etching techniques known to one of ordinary skill in the art of microelectronic device manufacturing, such as but not limited to a wet etching, a dry etching, or any combination thereof.

Figure 6:
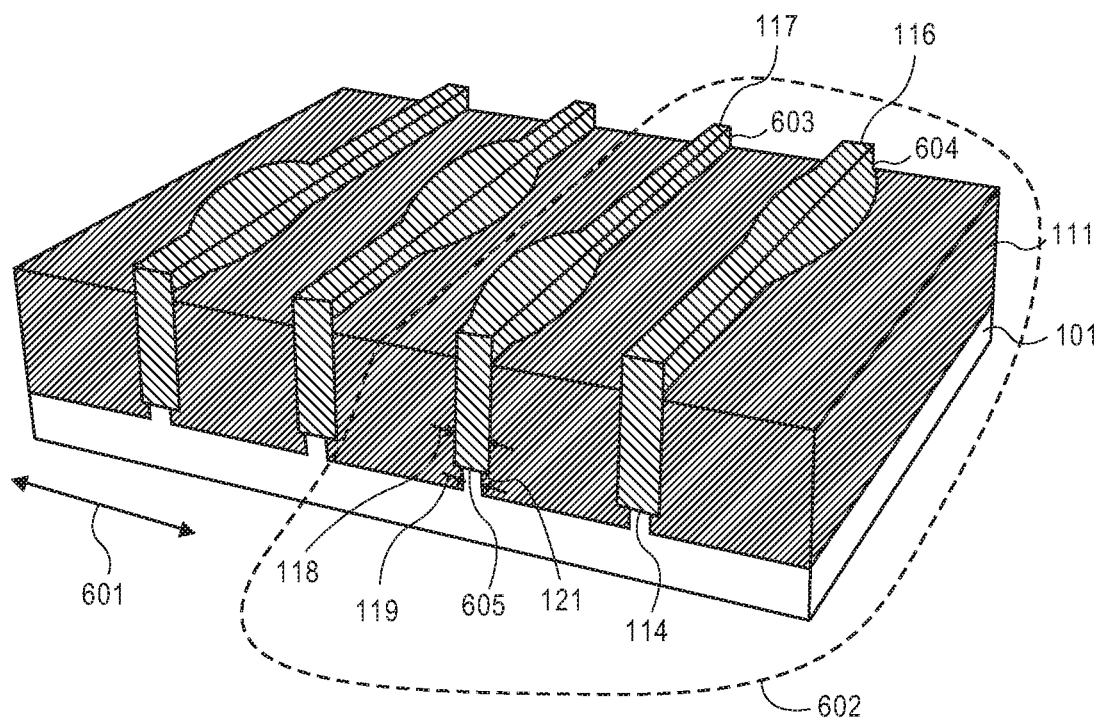
FIG. 6 is a view similar to FIG. 5, after a replacement fin layer is deposited on the recessed native fins in the trenches according to one embodiment.

FIG. 6 is a view 600 similar to FIG. 5, after a replacement fin layer is deposited on the recessed native fins in the trenches according to one embodiment. As shown in FIG. 6, the replacement fin layer comprises one or more replacement fins, such as replacement fins 116 and 117 that are selectively deposited on the recessed native fins, such as recessed native fins 114 and 115 respectively. The replacement fins 116 and 117 are grown from the top of the recessed fins 114 and 115 substantially vertically and not deposited on the sidewalls of the trenches 112 and 113 as seen in FIG. 5. In one embodiment, more than 99.9% of deposition of the replacement fins occurs on the recessed native fins rather than on the sidewalls of the trenches. In one embodiment, the replacement fins 116 and 117 are single crystal fins.

In one embodiment, the replacement fins are selectively deposited on the recessed native fins using one of epitaxial growth techniques, such as but not limited to a chemical vapour deposition (CVD), e.g., a rapid thermal CVD, a physical vapor deposition (PVD), molecular beam epitaxy ("MBE"), metalorganic chemical vapor deposition ("MOCVD"), atomic layer deposition ("ALD"), or other monocrystalline deposition technique known to one of ordinary skill in the art of microelectronic device manufacturing.

In one embodiment, a material of the replacement fins is different from a material of the native fins. In one embodiment, each of the replacement fins is a single crystal fin. In one embodiment, each of the replacement fins is a germanium (Ge) fin, a silicon germanium (SiGe) fin, a germanium tin fin, or any combination thereof. In another embodiment, each of the replacement fins is a III-V material fin.

Generally, the III-V material refers to a compound semiconductor material that comprises at least one of group III elements of the periodic table, e.g., aluminum ("Al"), gallium ("Ga"), or indium ("In"), and at least one of group V elements of the periodic table, e.g., nitrogen ("N"), phosphorus ("P"), arsenic ("As"), or antimony ("Sb"). In one embodiment, an interface 605 between the replacement fin and the native fin is substantially flat and has a non-faceted morphology.

As shown in FIG. 6, a width 118 of the replacement fin is greater than a width 119 of the recessed native fin so that a step 121 is formed at interface 605. That is, as the replacement material grows on the native fins, the replacement material pushes the surrounding insulating material out of the way, so that the replacement fin becomes fatter than the native fin, as shown in FIG. 6. As shown in FIG. 6, the epitaxial replacement fin films grown on the recessed native fins fills the openings 113 and 112 in the insulating layer 111 and slightly extends above the top surface of the insulating layer 111 so that non-planar portions 603 and 604 of the replacement fin layer are formed.

Figure 7:
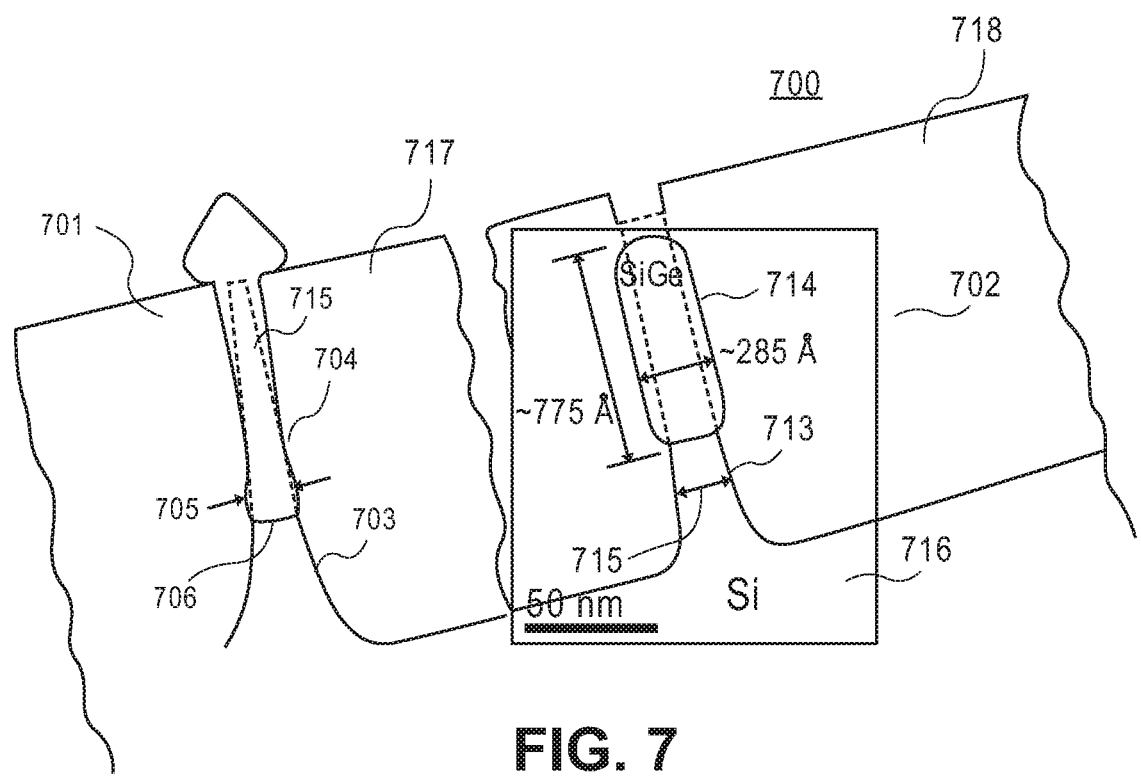
FIG. 7 is a view showing example images of high quality SiGe fins deposited on non-faceted and non ion-damaged silicon bottom fin surfaces according to one embodiment.

FIG. 7 is a view 700 showing example images 701 and 702 of high quality SiGe fins 704 and 714 deposited on non-faceted and non ion-damaged silicon bottom fin surfaces 703 and 713 respectively according to one embodiment. As shown in image 701, a width 705 of the SiGe fin 704 is greater than a width 706 of the silicon fin 703 on which the SiGe fin is deposited. As shown in image 701, the SiGe fin 704 deposited in the trench in an insulating layer 717 replaces an upper portion 715 of the native silicon fin 703, whose shape is indicated by a dotted line. As shown in image 702, the SiGe fin 714 deposited in the trench in an insulating layer 717 replaces an upper portion of the native silicon fin 713, whose shape is indicated by a dotted line. In one embodiment, the width of the upper portion of the native silicon fin that defines the width of the trench in the insulating layer surrounding the fin before the replacement material is deposited is at least 5 nm. In one embodiment, widening of the replacement fin is about 3 nm per side near the top of the trench so that the width 705 of the SiGe fin is at least about 11 nm. In one embodiment, the replacement SiGe fin is trimmed down to the width of less than 10 nm, as described in further detail below. As shown in image 702, the height of the SiGe fin 714 is about 775 angstroms (Å), and the width of the SiGe fin 714 is about 285 angstroms (Å) that is greater than a width 712 of the bottom silicon fin 716. In one embodiment, the extent to which the replacement fin is wider than the native fin varies based on the surrounding insulating material 111 and process conditions.

Figure 8:
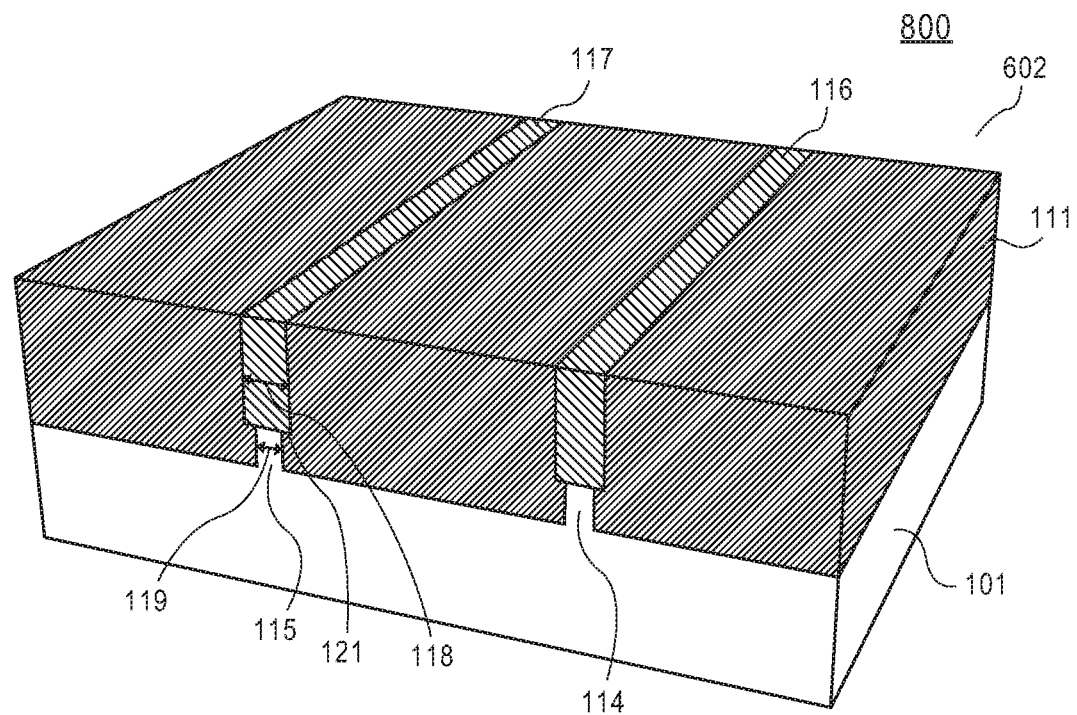
FIG. 8 is a view showing a portion of the electronic device structure depicted in FIG. 6 after removing the non-planar portions of the replacement fin layer according to one embodiment.

FIG. 8 is a view 800 showing a portion 602 of the electronic device structure depicted in FIG. 6 after removing the non-planar portions 603 and 604 of the replacement fin layer according to one embodiment. As shown in FIG. 8, the non-planar portions 603 and 604 are removed to even out the top surfaces of the replacement fins with the top surface of the insulating layer 111. In one embodiment, the non-planar portions of the replacement fin layer are removed using a polishing process, e.g., a chemical-mechanical planarization ("CMP") process known to one of ordinary skill in the art of microelectronic device manufacturing.

In one embodiment, after performing the shallow trench recess (STR) processing to form base silicon fins, filling the STR trenches with an insulating layer, planarizing the insulating layer, and etching back the silicon native fins, a silicon-germanium (SiGe) alloy of arbitrary composition, germanium, germanium-tin alloy or III-V material of arbitrary composition is deposited on the recessed silicon native fins. In this case, the silicon diffusion region of the silicon native fins merely acts as a template or placeholder to facilitate the STR processing. For long and narrow lines (e.g., for fins having height to width ratio of at least 3:1 and the width less than 30 nm), replacement films grow epitaxially with much lower crystalline defect densities than possible with a large area planar growth. The epitaxial replacement fin film growth on the recessed fins proceeds to fill the openings in the insulating layer 111 and slightly higher. In one embodiment, post-film-growth polish processing is used to trim the replacement fin film flat with the surrounding trench insulator material.

Figure 9:
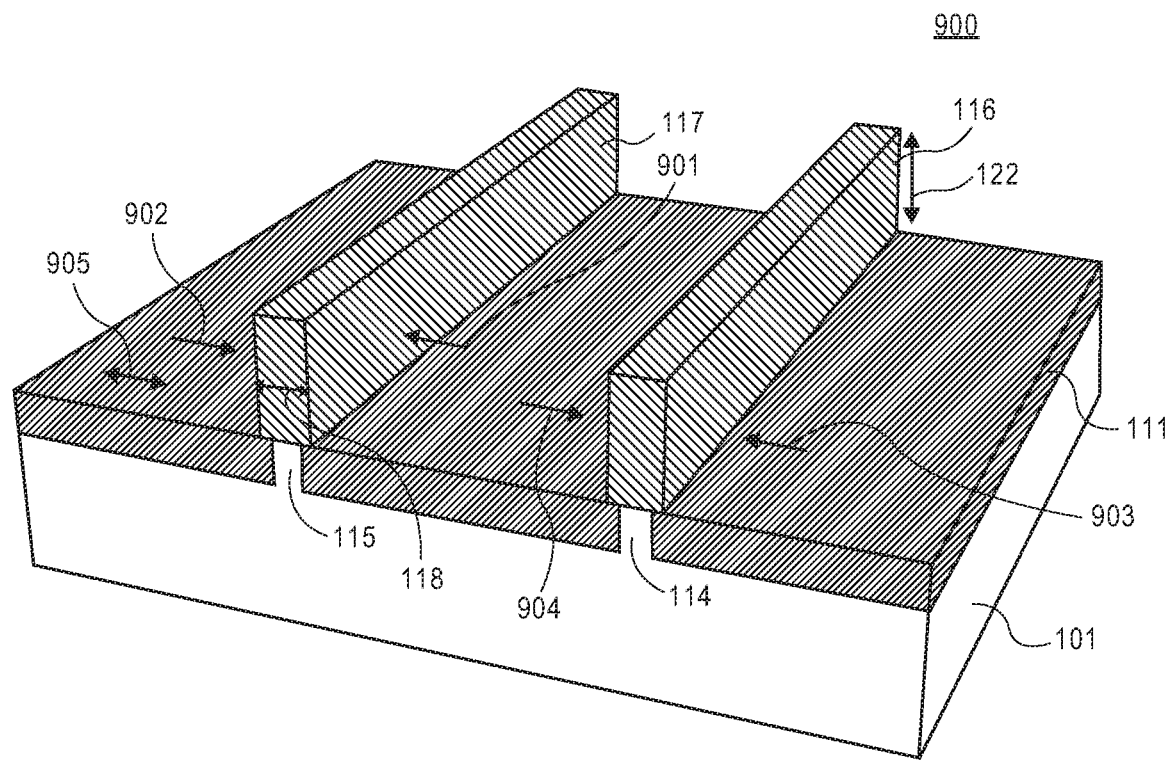
FIG. 9 is a view similar to FIG. 8 after the insulating layer is recessed to expose sidewalls of the replacement fins according to one embodiment.

FIG. 9 is a view 900 similar to FIG. 8 after the insulating layer 111 is recessed to expose sidewalls of the replacement fins 116 and 117 according to one embodiment. As shown in FIG. 9, the insulating layer 111 is recessed down to expose sidewalls 901 and 902 of the replacement fin 117. In one embodiment, the insulating layer 111 is recessed down to a predetermined depth such that the replacement fins exude above the insulating layer surface. In one embodiment, the insulating layer 111 is recessed down to level with the bottom of the replacement fin. In an embodiment, the insulating layer 111 is recessed using one of etching techniques known to one of ordinary skill in the art of microelectronic device manufacturing, such as but not limited to a wet etching, a dry etching, or any combination thereof. In an embodiment, insulating layer 111 of silicon oxide is etched using wet chemistry such as a hydrofluoric acid ("HF") solution or dry chemistry such as a halogen plasma etch.

Generally, the width of the replacement fin, such as width 118 defines a transistor channel. The narrower the replacement fin, the better the transistor characteristics, e.g., the ability to shut off the transistor when the gate voltage is withdrawn. Narrowing the replacement fin reduces the parasitic leakage current between the source and drain of the transistor when the gate voltage is withdrawn.

In one embodiment, the replacement fin is trimmed laterally along a lateral axis 905 extending substantially parallel to the width of the replacement fin, so that portions of the replacement fin are removed off the opposing sidewalls 901 and 902. In one embodiment, the width 118 of the replacement fin is adjusted based on the width 115 of the native fin.

In one embodiment, the replacement fin is trimmed laterally using a wet etch, a dry etch, or a combination thereof. In one embodiment, the replacement fin is trimmed laterally using an isotropic etch. In one embodiment, the wet etch to trim the lateral dimension of the replacement fin includes dilute ammonium hydroxide with or without peroxide or ozone. In one embodiment, the replacement fin is trimmed laterally using a wet etch chemistry comprising at least an ammonium hydroxide and water, wherein a ratio of water to the ammonium hydroxide is at least 100:1. In one embodiment, the replacement fin is trimmed laterally using a dry etch with a chemistry comprising fluorine, chlorine, bromine, or any combination thereof with a source power less than 2000 W. In one embodiment, the replacement fin is trimmed laterally using a remote plasma source.

In one embodiment, the replacement fin of at least one of Si or SiGe is trimmed laterally using a wet etch chemistry comprising a dilute ammonium hydroxide having a water to ammonium hydroxide ratio of about 100:1 for about 60 seconds. In another embodiment, the replacement fin of at least one of Si or SiGe is trimmed laterally using a dry etch having a chemistry comprising about 5 standard cubic centimeters per minute (sccm) NF3, 400 sccm Ar, at a plasma source power of about 2 kW, at a pressure of about 20 mT for about 20 seconds (sec). In yet another embodiment, the replacement fin of at least one of Si or SiGe is trimmed laterally using a dry etch having a chemistry comprising about 20 sccm SF6, 400 sccm Ar, at a plasma source power of about 2 kW, at a pressure of about 200 mT for about 20 sec.

In one embodiment, the replacement fin of Ge is trimmed laterally using a wet etch chemistry comprising dilute sulfuric acid having a water to sulfuric acid ratio of about 100:1. In another embodiment, the replacement fin of Ge is trimmed laterally using a dry etch having a chemistry comprising 5 sccm Cl2, 400 sccm Ar at a plasma source power of about 2 kW, at a pressure of about 20 mT, for about 20 sec. In yet another embodiment, the replacement fin of Ge is trimmed laterally using a dry etch having a chemistry comprising 20 sccm SF6, 400 sccm Ar at a plasma source power of about 2 kW, a pressure of about 200 mT for about 20 sec.

In one embodiment, the replacement fin of III-V material is trimmed laterally using a wet etch chemistry comprising a dilute ammonium hydroxide having a water to ammonium hydroxide ratio of about 100:1 for about 60 sec. In one embodiment, the replacement fin of indium rich layers is trimmed laterally using a wet etch chemistry comprising a hydrochloric acid (HCl) having a water to HCl ratio of about 50:1 for about 60 sec. In another embodiment, the replacement fin of III-V material is trimmed laterally using a dry etch having a chemistry comprising about 5 sccm NF3, 400 sccm Ar at a plasma source power of about 2 kW, a pressure of about 20 mT for about 20 sec. In yet another embodiment, the replacement fin of the III-V material is trimmed laterally using a dry etch having a chemistry comprising about 20 sccm SF6, about 400 sccm Ar, at a plasma source power of about 2 kW, a pressure of about 200 mT for about 20 sec.

Figure 10A:
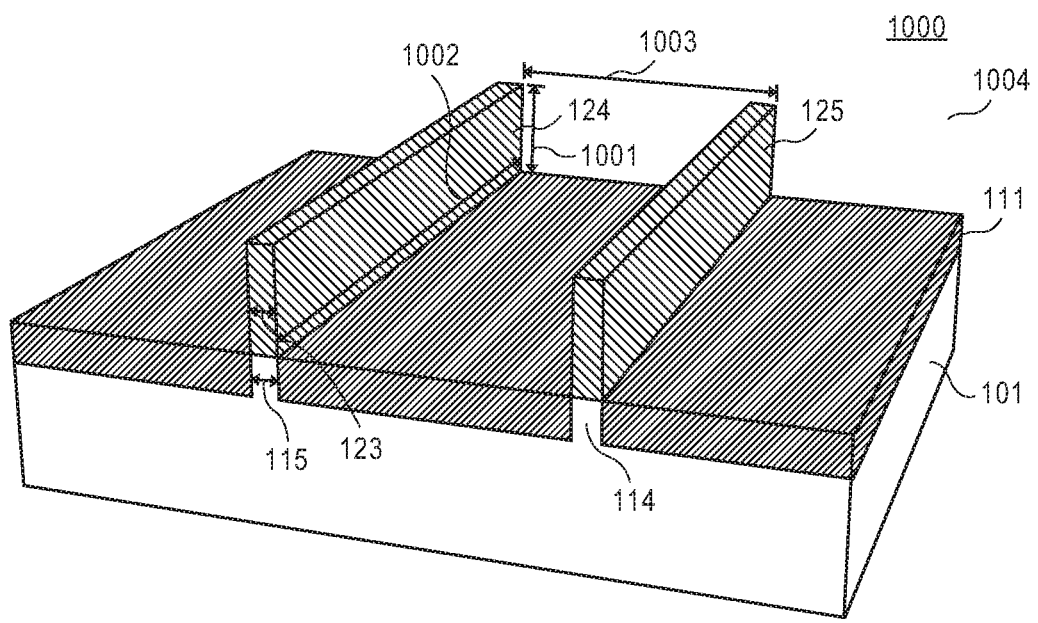
FIG. 10A is a view similar to FIG. 9 after the replacement fins are trimmed in the lateral dimension to form trimmed fins according to one embodiment.

FIG. 10A is a view 1000 similar to FIG. 9 after the replacement fins are trimmed in the lateral dimension to form trimmed fins 124 and 125 according to one embodiment. As shown in FIG. 10A, the replacement fin 124 has a width 123, a height 1001, and a length 1002. The width 123 of the trimmed replacement fin 124 is smaller than or equal to the width 115 of the native fin. In one embodiment, the height of the trimmed replacement fin 124 is smaller than the height of the initial replacement fin 117 before trimming. The loss of height of the replacement fin can be compensated by forming the initial replacement fins 116 and 117 taller than otherwise necessary to yield the desired end height.

In one embodiment, width 123 is in an approximate range from about 3 nm to about 30 nm. In one embodiment, the width 123 is less than about 5 nm. In one embodiment, the width 123 is from about 2 nm to about 5 nm. In one embodiment, the length of the fin is greater than the width and is determined by design of the electronic device. In one embodiment, the length of the fin is from about 50 nm to hundreds of microns. In an embodiment the fin height 1001 is in an approximate range from about 20 nm to about 80 nm. As shown in FIG. 10A, the trimmed replacement fins 124 and 125 are spaced apart by a distance (pitch) 1003. In one embodiment, the pitch is from about 15 nm to about 100 nm.

Figure 10B:
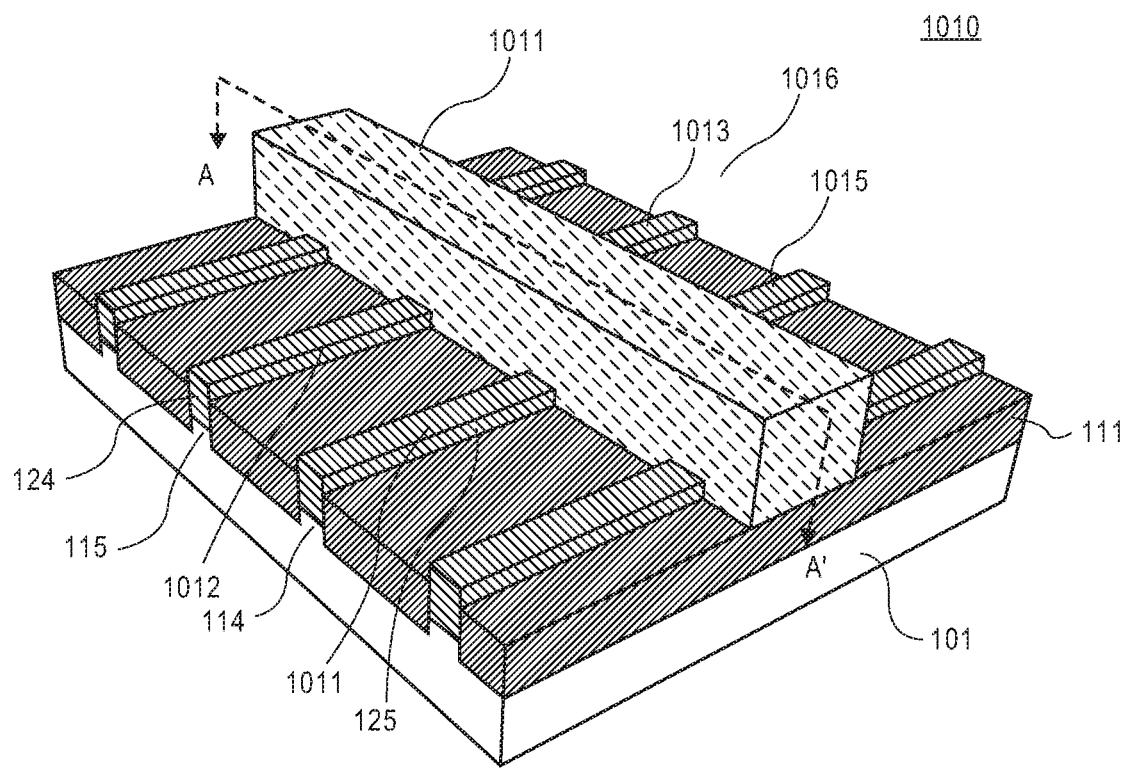
FIG. 10B is a perspective view of the electronic device structure including a portion that is similar to a portion of the electronic device structure depicted in FIG. 10A, after depositing a gate electrode and forming source/drain regions according to one embodiment.

FIG. 10B is a perspective view of the electronic device structure 1010 including a portion 1016 that is similar to a portion of the electronic device structure 1004 depicted in FIG. 10A, after depositing a gate electrode 1011 on the trimmed replacement fins 124 and 125 and forming source/drain regions 1012, 1013, 1014 and 1015 at opposite sides of the gate structure according to one embodiment.

In one embodiment, electronic device structure 1010 is a non-planar transistor structure, and each of the trimmed replacement fins 124 and 125 is configured for a non-planar transistor (e.g., a tri-gate transistor, all around gate transistor, or other non-planar transistor structure). In one embodiment, each of the trimmed replacement fins 124 and 125 has three sides configured for a tri-gate transistor. In another embodiment, each of the trimmed replacement fins 124 and 125 includes a nanowire of the replacement material for a nanowire transistor. In yet another embodiment, each of the trimmed replacement fins 124 and 125 includes a nanoribbon of the replacement material for a nanoribbon transistor.

In one embodiment, gate electrode 1011 is deposited on a gate dielectric layer (not shown). In one embodiment, the gate dielectric layer is formed on all sides of the trimmed replacement fins 124 and 125. In another embodiment, the gate dielectric layer is formed at least one two opposing sides of the trimmed replacement fins 124 and 125.

In one embodiment, the gate dielectric layer is deposited on the top portion and opposing sidewalls of the portion of the trimmed replacement fins 124 and 125 on which a gate electrode is formed later on in a process. In one embodiment, the gate dielectric layer is an oxide layer, e.g., a silicon oxide layer, an aluminum oxide, a hafnium containing oxide, or any combination thereof. In one embodiment, the gate dielectric layer underneath the gate electrode 1011 is a high-k dielectric material, for example, hafnium oxide, hafnium silicon oxide, hafnium zirconium oxide (HfxZryOz), lanthanum oxide (La2O3), lanthanum aluminum oxide, zirconium oxide, zirconium silicon oxide, tantalum oxide, tantalum silicate (TaSiOx), titanium oxide, barium strontium titanium oxide, barium titanium oxide, strontium titanium oxide, yttrium oxide, aluminum oxide (e.g., Al2O3), lead scandium tantalum oxide, and lead zinc niobate, or other high-k dielectric materials. In one embodiment, the thickness of the gate dielectric layer is from about 2 angstroms (Å) to about 20 Å. In an embodiment, a silicon rich transition layer may exist between the semiconductor layer and gate insulator.

In alternative embodiments, the gate dielectric layer is deposited using one of deposition techniques, such as but not limited to, a chemical vapour deposition ("CVD"), e.g., a plasma enhanced chemical vapour deposition ("PECVD"), a physical vapour deposition ("PVD"), molecular beam epitaxy ("MBE"), metalorganic chemical vapor deposition ("MOCVD"), atomic layer deposition ("ALD"), spin-on, or other deposition techniques known to one of ordinary skill in the art of microelectronic device manufacturing. The gate dielectric layer is patterned and etched using one or more patterning and etching techniques known to one of ordinary skill in the art of microelectronic device manufacturing.

In one embodiment, a dummy (sacrificial) gate electrode is deposited on the dielectric layer on the trimmed replacement fins 124 and 125 prior to deposition of the gate electrode 1011. Typically, the dummy gate electrode, or the dummy electrode and the underlying dummy dielectric are removed and replaced with a final gate electrode stack after source/drain regions are formed later in a process. Example dummy gate dielectric materials include silicon dioxide, and example dummy gate electrode materials include polysilicon, although any suitable dummy/sacrificial gate dielectric and/or electrode materials can be used. In one embodiment, spacers (not shown) are formed on the opposite sidewalls of the dummy gate electrode stack by using one of the spacer deposition techniques known to one of ordinary skill of microelectronic device manufacturing. In one embodiment, the spacers are nitride spacers (e.g., silicon nitride), oxide spacers, carbide spacers (e.g., silicon carbide), or other spacers known to one of ordinary skill in the art of microelectronic device manufacturing. In one embodiment, source/drain regions are formed on the areas of the trimmed replacement fins 124 and 125 defined by the spacers at opposite sides of the dummy gate electrode, and then the dummy gate electrode is replaced by the final gate electrode, as known to one of ordinary skill in the art of electronic device manufacturing. In another embodiment, the source/drain regions are formed after the final gate electrode stack 1011 is formed.

Figure 10C:
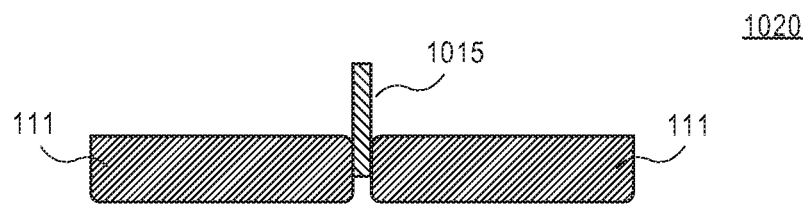
FIG. 10C is a view showing an example of a portion of the fin structure along an axis A-A' shown in FIG. 10B after trimming that is performed before a gate formation according to one embodiment.

In one embodiment, the replacement fin is trimmed laterally before forming a gate in a gate-first flow, as described above with respect to FIGS. 9 and 10A. FIG. 10C is a view 1020 showing an example of a portion of the fin structure along an axis A-A' shown in FIG. 10B after trimming that is performed before the gate formation in a gate-first flow according to one embodiment. Substrate 101 and gate electrode stack 1011 are not shown in the view 1020. In this embodiment, the cross sectional shape of the fin in the channel region is nominally uniform, as shown in FIG. 10C.

Figure 10D:
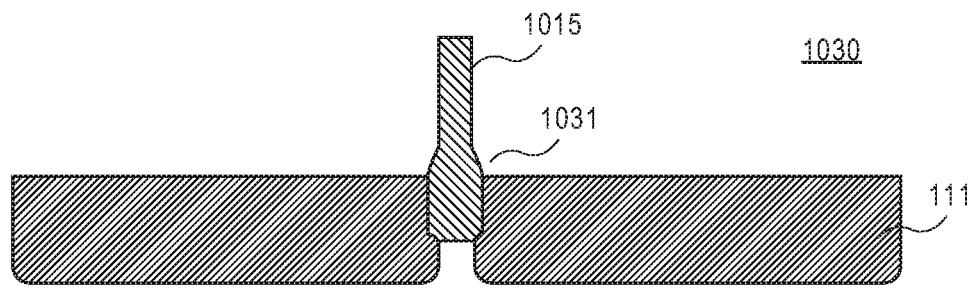
FIG. 10D is a view 1030 showing an example of the trimmed fin structure along an axis A-A' shown in FIG. 10B when the trimming is performed after a sacrificial gate processing in a gate-last flow according to another embodiment.

In another embodiment, trimming of a portion of the replacement fin laterally is performed after the sacrificial gate processing in a gate-last flow. FIG. 10 D is a view 1030 showing an example of the trimmed fin structure along an axis A-A' shown in FIG. 10B when the trimming is performed after the sacrificial gate processing in a gate-last flow according to another embodiment. Substrate 101 and gate electrode stack 1011 are not shown in the view 1030. In this case, the fin width is trimmed in the replacement gate portion of the flow. When the fin width is trimmed in the replacement gate portion of the flow, the side portions of the fin that are covered by the insulating material 102 are prevented from being trimmed by the insulating material, so that a bulge 1031 is formed at the bottom of the fin, as shown in FIG. 10D. The portion of the trimmed replacement fin underneath gate electrode 1011 between the source and drain regions defines a channel region of a transistor. The channel region can also be defined as the area of the trimmed replacement fin surrounded by the gate electrode 1011. At times however, the source/drain regions may extend slightly beneath the gate electrode through, for example, diffusion to define a channel region slightly smaller than the gate electrode length (Lg). In an embodiment, the channel region of the fin is intrinsic or undoped. In an embodiment, channel region of the fin is doped either by in-situ doping during layer growth or by well implant, for example to a concentration level of between $1\times10^{16}$ to $1\times10^{19}$ atoms/cm3. In an embodiment, when the channel region is doped it is doped to the opposite conductivity type of the source region and the drain region. For example, when the source and drain regions 1011 and 1015 are n-type conductivity the channel region of the fin 125 is doped to a p-type conductivity. For example, when the source and drain regions 1011 and 1015 are p-type conductivity the channel region of the fin 125 is an n-type conductivity. In this manner each of the non-planar transistors of the electronic device structure 1010 can be formed into a NMOS transistor or a PMOS transistor.

The gate electrode 1011 can be formed of any suitable gate electrode material. The gate electrode may comprise a metal-containing material or another material or materials. In various embodiments, the material or materials of the gate electrode 1011 may be chosen to provide a desired work function. In an embodiment, the gate electrode 1011 can be a metal gate electrode, such as but not limited to ruthenium, tungsten, tantalum, titanium, and their nitrides. It is to be appreciated, the gate electrode need not necessarily be a single material and can be a composite stack of thin films, such as but not limited to a polycrystalline silicon/metal electrode or a metal/polycrystalline silicon electrode.

As shown in FIG. 10B, a source region 1014 and a drain region 1015 are formed on the trimmed replacement fin 125, and a source region 1012 and a drain region 1013 are formed on the trimmed replacement fin 124 at opposite sides of gate electrode 1011, as shown in FIG. 10B. In an embodiment, the source/drain regions have a doping concentration in an approximate range from about $1\times10^{19}$ to about $1\times10^{21}$ atoms/cm$^3$. In an embodiment, source region 1011 is electrically coupled to a source landing pad (not shown) and the drain region 1015 is electrically coupled to a drain landing pad (not shown). Alternatively, the source/drain regions can be coupled to higher levels of metallization (e.g., metal 1, metal 2, metal 3, and so on) used to electrically interconnect various components of the integrated circuit together into functional circuits. The source/drain regions can be formed using one of techniques known to one of ordinary skill in the art of electronic device manufacturing. In one embodiment, the source/drain regions are formed using an ion implantation technique known to one of ordinary skill in the art of electronic device manufacturing. In another embodiment, forming the source/drain regions involves recessing portions of the fin outside of the channel region (region protected by gate electrode and spacer) and depositing a replacement material into the recesses using one or more material deposition techniques known to one of ordinary skill in the art of electronic device manufacturing. In yet another embodiment, the source/drain regions are cladded with an epitaxial layer.

In one embodiment, the cross sectional profile of the source/drain region does not match that of the channel region. In another embodiment, the cross sectional profile of the source/drain region matches that of the channel region.

In one embodiment, a lithographic masking is used to independently define p-MOS and n-MOS regions of the transistors such that any set of replacement materials can be used in combination, as described in further detail below.

Figure 11:
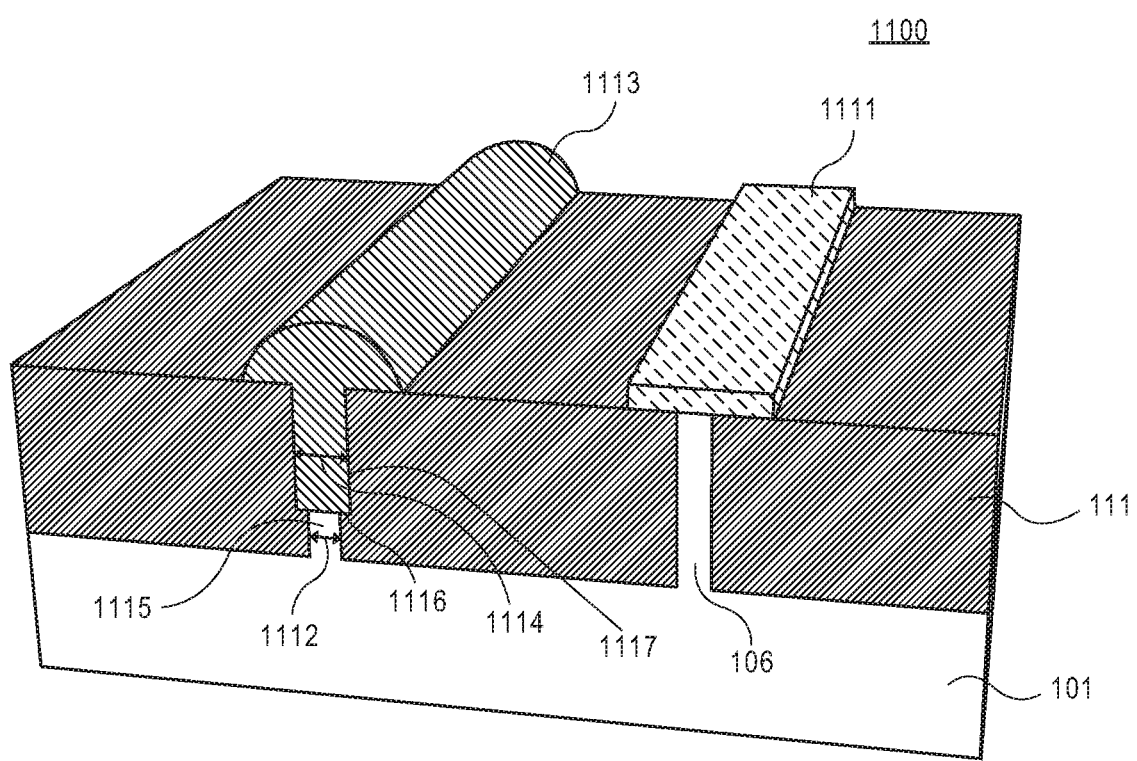
FIG. 11 is a view showing the electronic device structure that is similar to a portion of the electronic device structure depicted in FIG. 4, after recessing a set of native fins and depositing replacement fins on the set of recessed native fins according to one embodiment.

FIG. 11 is a view 1100 showing the electronic device structure that is similar to a portion 401 of the electronic device structure depicted in FIG. 4, after recessing a set of native fins including native fin 105 to form trenches, such as a trench 1117 and depositing replacement fins on the set of recessed native fins according to one embodiment. As shown in FIG. 11, native fin 105 is recessed to form a recessed fin 1112 in trench 1117, while other set of native fins including native fin 106 are protected from recessing by a protection layer 1111. A replacement fin layer 1113 is deposited on the recessed native fins in the trenches, as described above. Replacement fin layer 1113 represents one of the replacement fin layers described above. The protection layer 1111 is used to protect the set of native fins including native fin 106 while the trench 1115 is formed and replacement fin layer 1113 is deposited.

In one embodiment, protection layer 1111 is one of the hard mask layers described above with respect to hard mask layer 102. In one embodiment, the protection layer 1111 is deposited and patterned using one of the protection layer deposition and patterning techniques known to one of ordinary skill in the art of microelectronic device manufacturing.

As shown in FIG. 11, a width 1114 of the replacement fin is greater than a width 1115 of the recessed native fin 1112 so that a step 1116 is formed at the interface between the replacement fin and the recessed native fin, as described above with respect to FIG. 6.

Figure 12:
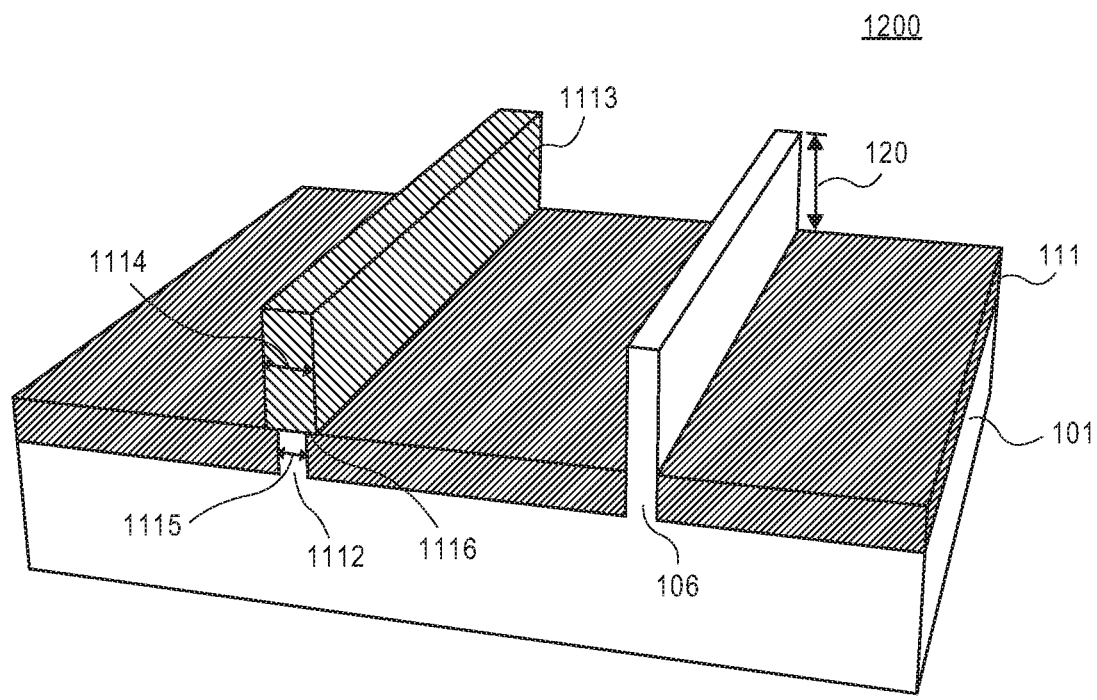
FIG. 12 is a view similar to FIG. 11 after removing the non-planar portions of the replacement fin layer and recessing the insulating layer according to one embodiment.

FIG. 12 is a view 1200 similar to FIG. 11 after removing the non-planar portions of the replacement fin layer and recessing the insulating layer 111 to expose sidewalls of the replacement fins, such as replacement fin 1113 and sidewalls of the original (non-recessed) native fin, such as native fin 106 according to one embodiment. In one embodiment, the non-planar portions of the replacement fin layer 1113 are removed to even out the top surfaces of the replacement fin and the original native fin with the top surface of the insulating layer 111, as described above with respect to FIG. 8.

As shown in FIG. 12, the insulating layer 111 is recessed down to a predetermined depth 120 so that the replacement fin and original native fins exude above the insulating layer surface. In one embodiment, the insulating layer 111 is recessed down to level with the bottom of the replacement fin 1113. In an embodiment, the insulating layer 111 is recessed using one of etching techniques known to one of ordinary skill in the art of microelectronic device manufacturing, such as but not limited to a wet etching, a dry etching, or any combination thereof, as described above with respect to FIG. 9.

Figure 13:
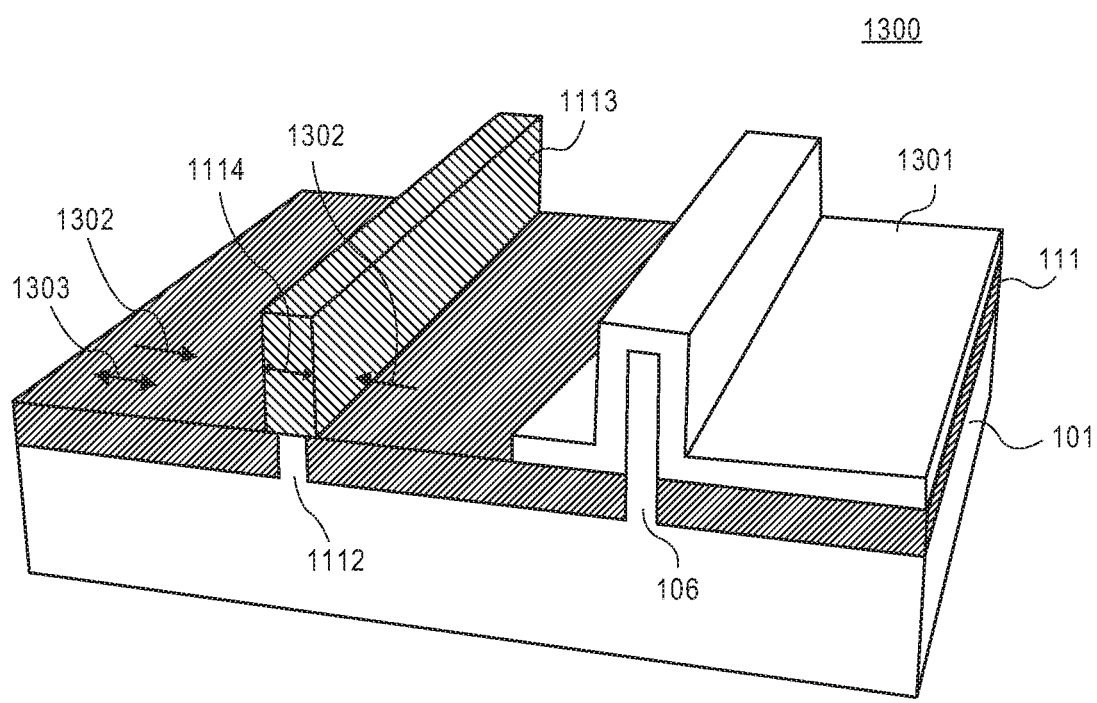
FIG. 13 is a view similar to FIG. 12 after a protection layer is deposited on a set of the original native fins according to one embodiment.

FIG. 13 is a view 1300 similar to FIG. 12 after a protection layer 1301 is deposited on a set of the original native fins, such as native fin 106 according to one embodiment. In one embodiment, protection layer 1301 is a hard mask layer. In one embodiment, protection layer 1301 is one of the hard mask layers described above with respect to hard mask layer 102. In one embodiment, the protection layer 1301 is deposited and patterned using one of the protection layer depositions and patterning techniques known to one of ordinary skill in the art of microelectronic device manufacturing.

After the protection layer 1301 is deposited on the original native fins, the replacement fins are trimmed along a lateral axis 1303 that is substantially parallel to the width 1114 of the replacement fin, so that portions of the replacement fin are removed off the opposing sidewalls 1302 of the replacement fin 1113. As shown in FIG. 13, the replacement fin 1113 is trimmed while the original native fin 106 is not affected by trimming. In one embodiment, width 1114 of the replacement fin 1113 is adjusted based on the width 1115 of the underlying native fin 1112. In one embodiment, the replacement fin is trimmed laterally using one of the etching techniques, as described above with respect to FIG. 9.

Figure 14:
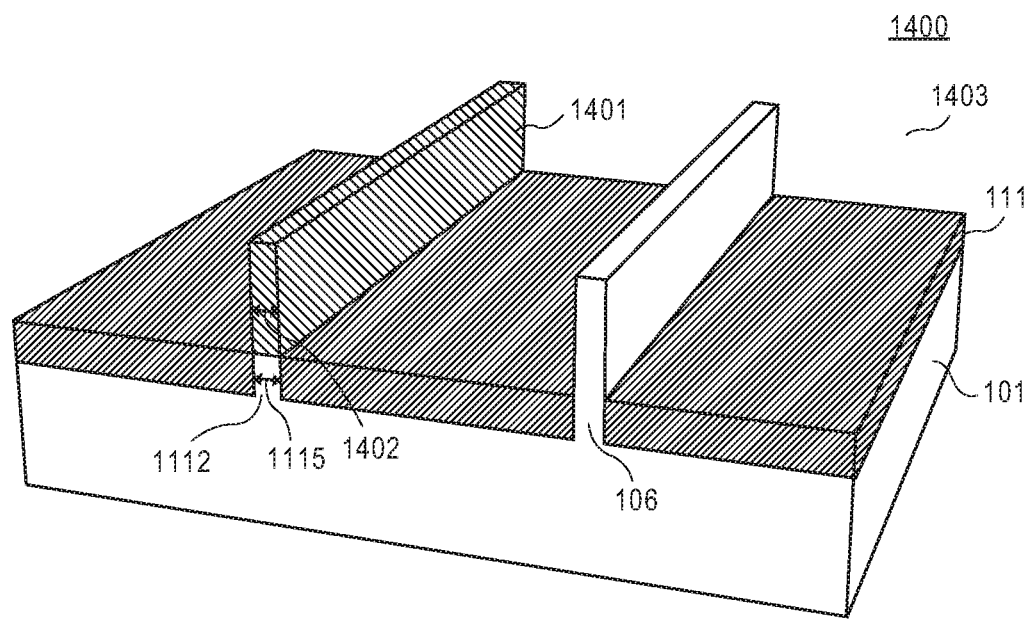
FIG. 14 is a view similar to FIG. 13, after a set of the replacement fins are trimmed in the lateral dimension to form a set of trimmed fins according to one embodiment.

FIG. 14 is a view 1400 similar to FIG. 13, after a set of the replacement fins are trimmed in the lateral dimension to form a set of trimmed fins according to one embodiment. As shown in FIG. 14 original native fin 106 is not affected by trimming. As shown in FIG. 14, after trimming a width 1402 of the trimmed replacement fin 1401 is smaller than or equal to the width 115 of the recessed native fin 1112, as described above with respect to FIG. 10A. As shown in FIG. 14, the width of the original fin 106 remains substantially the same as before trimming.

Figure 15:
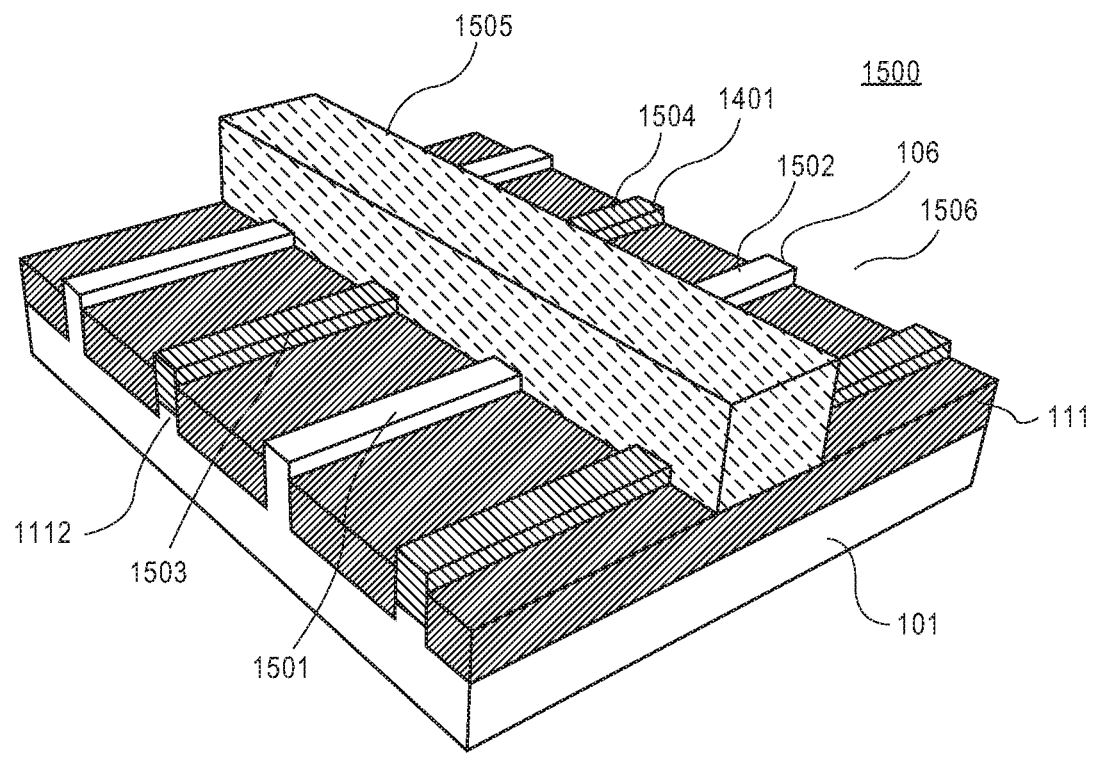
FIG. 15 is a perspective view of the electronic device structure including a portion that is similar to the electronic device structure depicted in FIG. 14, after depositing a gate electrode, and forming source/drain regions according to one embodiment.

FIG. 15 is a perspective view of the electronic device structure 1500 including a portion 1506 that is similar to the electronic device structure 1403 depicted in FIG. 14, after depositing a gate electrode 1505 on a gate dielectric layer (not shown) on the trimmed replacement fins, such as trimmed replacement fin 1401 and on the original native fins, such as original native fin 106, and forming source/drain regions 1501, 1502, 1503 and 1504 at opposite sides of the gate structure according to one embodiment.

In one embodiment, electronic device structure 1500 is a non-planar transistor structure (e.g., a tri-gate transistor, all around gate transistor, or other non-planar transistor structure), where each of the trimmed replacement fins is configured for a non-planar transistor p-MOS transistor, and each of the original native fins is configured for a non-planar transistor n-MOS transistor, or vice versa. In one embodiment, each of the trimmed replacement fins and original native fins has three sides configured for a tri-gate transistor. In another embodiment, each of the trimmed replacement fins and original native fins includes a nanowire of the replacement material for a nanowire transistor. In yet another embodiment, each of the trimmed replacement fins and original native fins includes a nanoribbon of the replacement material for a nanoribbon transistor.

In one embodiment, gate electrode 1505 is represented by one of the gate electrodes described above. In one embodiment, the gate dielectric layer underneath the gate electrode is represented by one of the gate dielectric layers described above.

A source region 1501 and a drain region 1502 are formed on the original native fin 106, and a source region 1503 and a drain region 1504 are formed on the trimmed replacement fin 1401 at opposite sides of gate electrode 1502, as shown in FIG. 15. In an embodiment, the source/drain regions 1501, 1502, 1503 and 1504 represents the source/drain regions described above.

In one embodiment, all original channel materials are replaced with suitable replacement materials, as described in further detail below.

Figure 16:
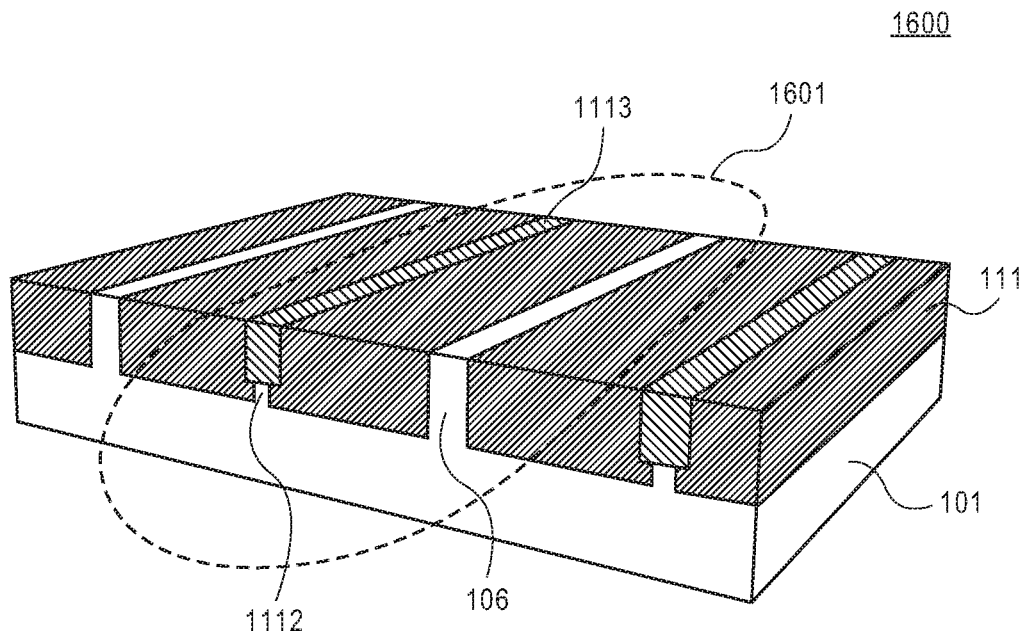
FIG. 16 is a perspective view of the electronic device structure including a portion that is similar to the electronic device structure depicted in FIG. 11, after removing the non-planar portions of the replacement fin layer according to one embodiment.

FIG. 16 is a perspective view of the electronic device structure 1600 including a portion 1601 that is similar to the electronic device structure 1100 depicted in FIG. 11, after removing the non-planar portions of the replacement fin layer 1113 according to one embodiment. In one embodiment, the non-planar portions of the replacement fin layer 1113 are removed to even out the top surfaces of the replacement fin 1113 and the original native fin 106 with the top surface of the insulating layer 111, as described above. As shown in FIG. 16, the width of the replacement fin 1113 is greater than the width of the recessed native fin 1112 so that a step is formed at the interface between the replacement fin and the recessed native fin, as described above. After the first replacement fin layer deposition on the recessed first set of fins and planarization, a second set of fins are recessed and a second replacement fin layer is deposited on the recessed second set of fins.

Figure 17:
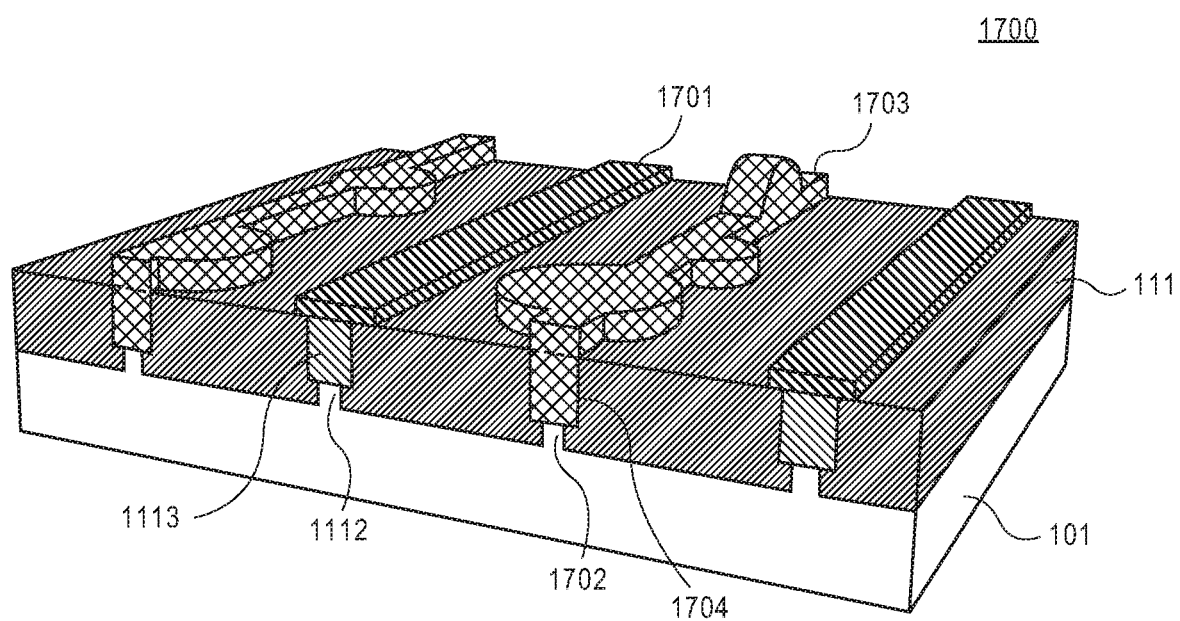
FIG. 17 is a view similar to FIG. 16, after other set of native fins are recessed and a replacement fin layer is deposited onto the recessed native fins according to one embodiment.

FIG. 17 is a view 1700 similar to FIG. 16, after other set of native fins that includes native fin 106 are recessed to form trenches and a replacement fin layer is deposited onto the recessed native fins in the trenches according to one embodiment. As shown in FIG. 17, native fin 106 is recessed to form a recessed fin 1702 in a trench 1704, while a protection layer 1701 is deposited on the replacement fin 1113. Replacement fin layer 1703 represents one of the replacement fin layers described above. The protection layer 1701 is used to protect the replacement fin 1113 on recessed native fin 1112 while the native fin 106 is recessed to form trench 1704 in insulating layer 111 and replacement fin layer 1703 is deposited on the recessed native fin 1702. In one embodiment, protection layer 1701 represents one of the protection layers described above. In one embodiment, the replacement fin 1113 is a germanium (Ge) fin, a silicon germanium (SiGe) fin, a germanium tin fin, or any combination thereof to form a and the replacement fin 1703 is a III-V material fin, or vise versa. In one non-limiting example embodiment, a SiGe replacement fin is used for a p-channel transistor and an InAs replacement fin is used for a n-channel transistor. In one embodiment, the order of replacement material deposition for p or n channel is determined based on at least in part on thermal budget considerations.

As shown in FIG. 17, the width of the replacement fin 1703 is greater than the width of the recessed native fin 1702 so that a step is formed at the interface between the replacement fin and the recessed native fin, as described above.

Figure 18:
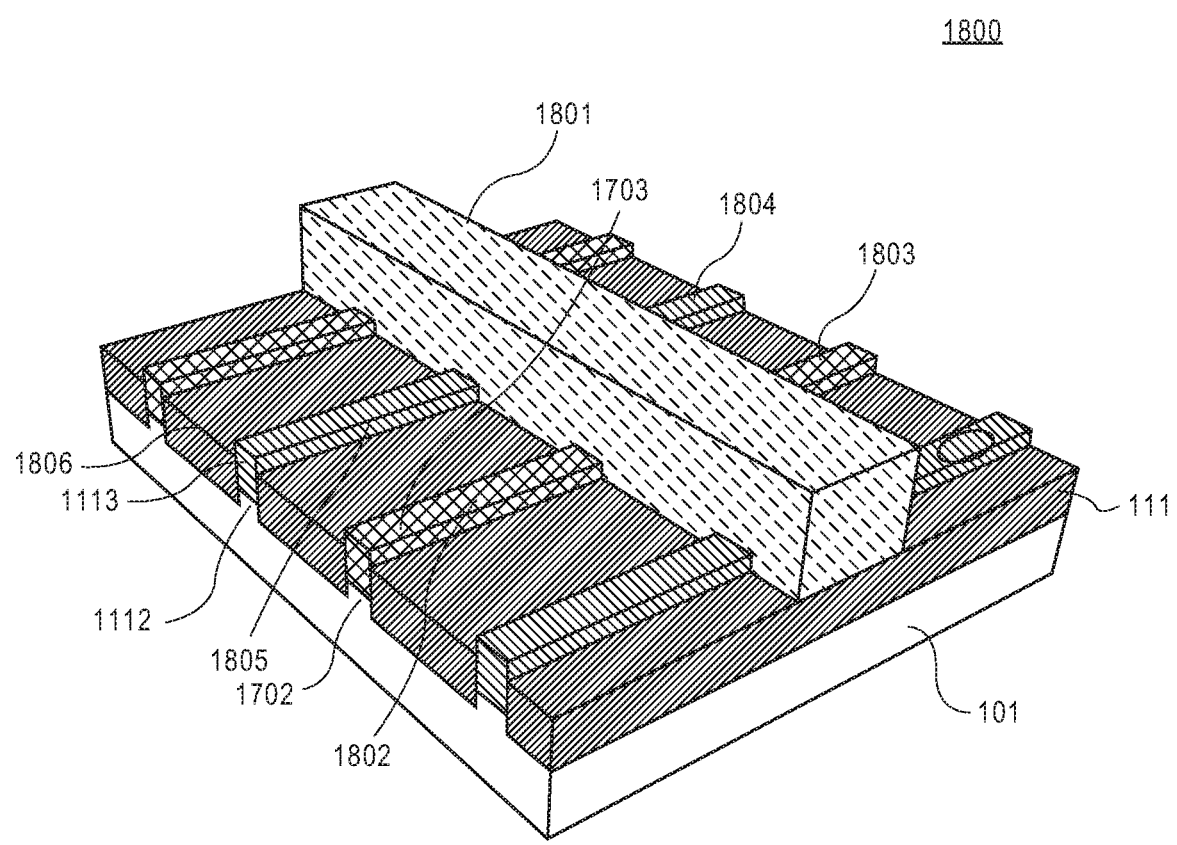
FIG. 18 is a view similar to FIG. 17, after trimming the replacement fins in the lateral dimension, depositing a gate electrode, and forming source/drain regions according to one embodiment.

FIG. 18 is a view 1800 similar to FIG. 17, after trimming the replacement fins 1113 and 1113 in the lateral dimension, depositing a gate electrode 1801 on a gate dielectric (not shown) on the trimmed replacement fins, and forming source/drain regions at opposite sides of the gate structure according to one embodiment. As shown in FIG. 18, the width of each of the trimmed replacement fins 1113 and 1703 is smaller than or equal to the width of the underlying recessed native fin, as described above. In one embodiment, the first set of replacement fins including replacement fin 1113 are trimmed laterally while a protection layer, such as one of the protection layers described above is deposited on the second set of replacement fins including replacement fin 1703, and vice versa. In one embodiment, the replacement fins for a p channel are trimmed before trimming the replacement fins for a n channel, or vice versa depending on design considerations. In another embodiment, the first and second sets of replacement fins are trimmed are trimmed at the same time.

In one embodiment, electronic device structure 1800 is a non-planar transistor structure (e.g., a tri-gate transistor, all around gate transistor, or other non-planar transistor structure), where each of the trimmed replacement fins of the first set is configured for a non-planar transistor p-MOS transistor, and each of the trimmed replacement fins of the second set is configured for a non-planar transistor n-MOS transistor, or vice versa. In one embodiment, each of the trimmed replacement fins of the first and second sets has three sides configured for a tri-gate transistor. In another embodiment, each of the trimmed replacement fins of the first set includes a nanowire of a replacement material for a p-type nanowire transistor, and each of the trimmed replacement fins of the second set includes a nanowire of a replacement material for a n-type nanowire transistor, or vice versa. In yet another embodiment, each of the trimmed replacement fins of the first set includes a nanoribbon of the replacement material for a p-type nanoribbon transistor, and each of the trimmed replacement fins of the second set includes a nanoribbon of the replacement material for a n-type nanoribbon transistor, or vice versa. In one embodiment, gate electrode 1801 is represented by one of the gate electrodes described above. In one embodiment, the gate dielectric underneath the gate electrode 1801 is represented by one of the gate dielectrics described above.

A source region 1802 and a drain region 1803 are formed on the replacement native fin 1702, and a source region 1805 and a drain region 1804 are formed on the trimmed replacement fin 1113 at opposite sides of gate electrode structure 11801, as shown in FIG. 18. In an embodiment, the source/drain regions 1802, 1803, 1804, and 1805 are represented by the source/drain regions described above.

Figure 19:
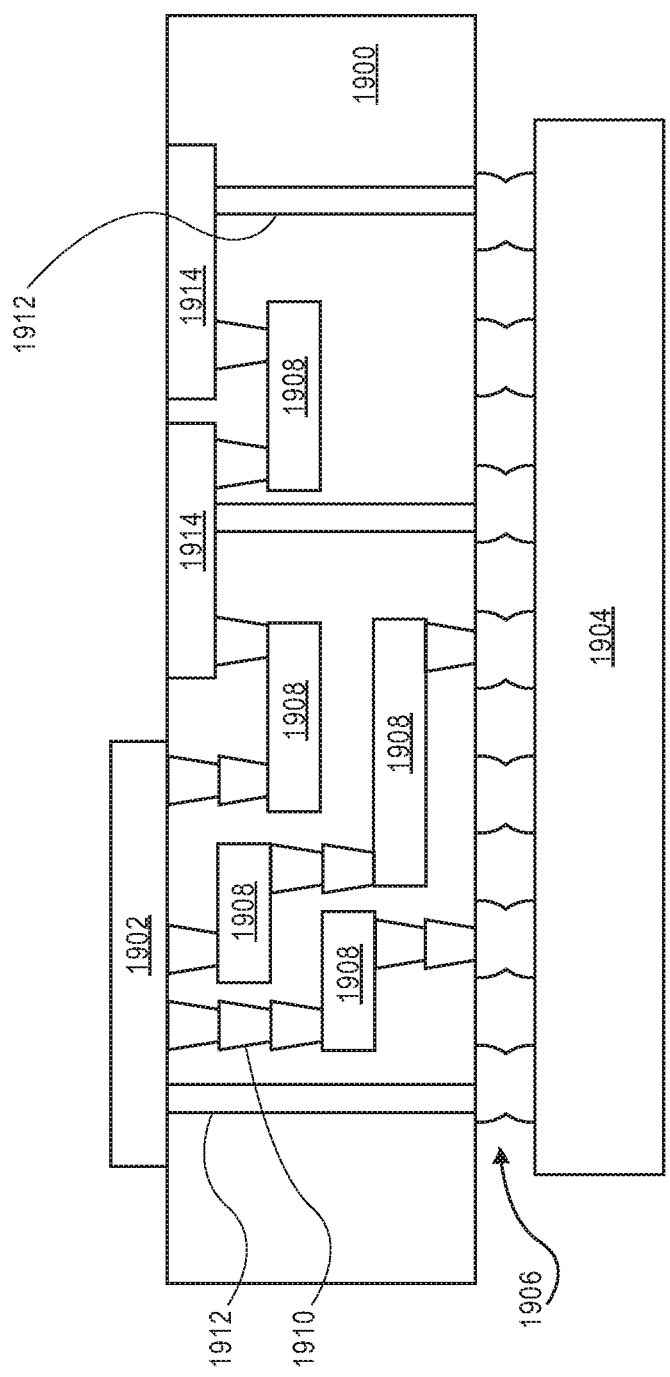
FIG. 19 illustrates an interposer according to one embodiment.

FIG. 19 illustrates an interposer 1900 according to one embodiment. The interposer 1900 is an intervening substrate used to bridge a first substrate 1902 to a second substrate 1904. The first substrate 1902 may be, for instance, an integrated circuit die. The second substrate 1904 may be, for instance, a memory module, a computer motherboard, or another integrated circuit die. Generally, the purpose of an interposer 1900 is to spread a connection to a wider pitch or to reroute a connection to a different connection. For example, an interposer 1900 may couple an integrated circuit die to a ball grid array (BGA) 1906 that can subsequently be coupled to the second substrate 1904. In some embodiments, the first and second substrates 1902/1904 are attached to opposing sides of the interposer 1900. In other embodiments, the first and second substrates 1902/1904 are attached to the same side of the interposer 1900. And in further embodiments, three or more substrates are interconnected by way of the interposer 1900.

The interposer 1900 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1908, vias 1910, including but not limited to through-silicon vias (TSVs) 1912. The interposer 1900 may further include embedded devices 1914, including passive and active devices. Such devices include, but are not limited to, the fin based transistors or other fin based devices as described above, capacitors, decoupling capacitors, resistors, inductors, fuses, diodes, transformers, sensors, and electrostatic discharge (ESD) devices, radio-frequency (RF) devices, power amplifiers, power management devices, antennas, arrays, sensors and MEMS devices. In accordance with embodiments of the invention, apparatuses or processes disclosed herein may be used in the fabrication of interposer 1900.

Figure 20:
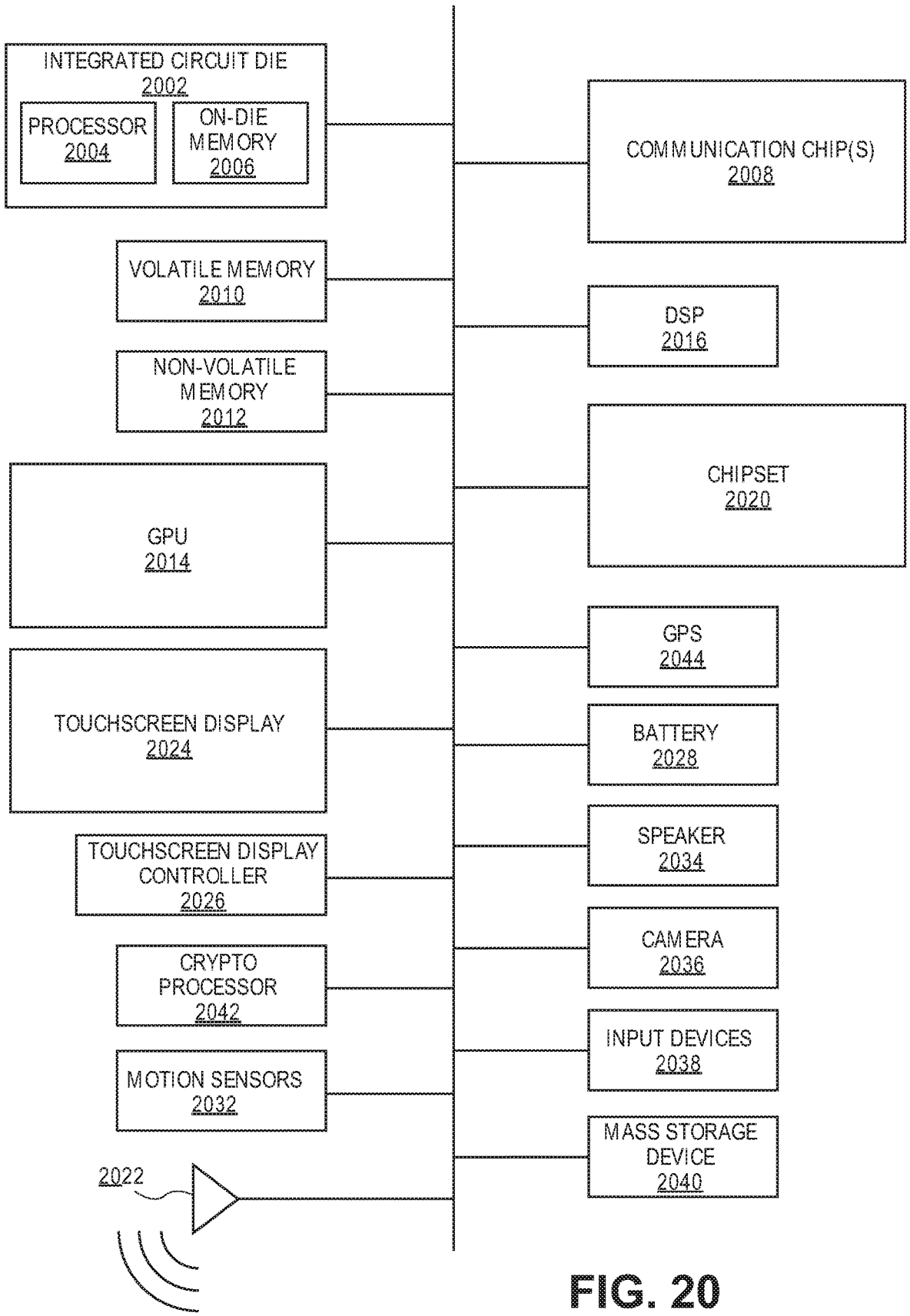
FIG. 20 illustrates a computing device in accordance with one embodiment.

FIG. 20 illustrates a computing device 2000 in accordance with one embodiment. The computing device 2000 houses a board 2002. The board 2002 may include a number of components, including but not limited to a processor 2004 and at least one communication chip 2008. The processor 2004 is physically and electrically coupled to the board 2002. In some implementations at least one communication chip is also physically and electrically coupled to the board 2002. In further implementations, at least one communication chip 2008 is part of the processor 2004.

Depending on its application, computing device 2000 may include other components that may or may not be physically and electrically coupled to the board 2002. These other components include, but are not limited to, a memory, such as an on-die memory 2006, a volatile memory 2010 (e.g., a DRAM), a non-volatile memory 2012 (e.g., ROM), a flash memory, a graphics processor 2014, a digital signal processor 2016, a crypto processor (not shown), a chipset 2020, an antenna 2022, a display, e.g., a touchscreen display 2024, a display controller, e.g., a touchscreen controller 2026, a battery 2028, an audio codec (not shown), a video codec (not shown), an amplifier, e.g., a power amplifier, a global positioning system (GPS) device 2044, a compass, an accelerometer (not shown), a gyroscope (not shown), a speaker 2034, a camera 2036, and a mass storage device 2040 (such as hard disk drive, compact disk (CD), digital versatile disk (DVD), and so forth).

A communication chip, e.g., communication chip 2008, enables wireless communications for the transfer of data to and from the computing device 2000. The term "wireless"

and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 2008 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 2000 may include a plurality of communication chips. For instance, a communication chip 2008 may be dedicated to shorter range wireless communications such as Wi-Fi and Bluetooth and other communication chip may be dedicated to longer range wireless communications such as GPS, EDGE, GPRS, CDMA, WiMAX, LTE, Ev-DO, and others.

In at least some embodiments, the processor 2004 of the computing device 2000 includes an integrated circuit die having fin based devices that have the replacement fins with the adjusted geometry, as described herein. The integrated circuit die of the processor includes one or more devices, such as fin based transistors or metal interconnects as described herein. The term "processor" may refer to any device or portion of a device that processes electronic data from registers and/or memory to transform that electronic data into other electronic data that may be stored in registers and/or memory. The communication chip 2008 also includes an integrated circuit die having the geometry tuned fin based devices on a silicon wafer according to the embodiments described herein.

In further implementations, another component housed within the computing device 2000 may contain an integrated circuit die having the geometry tuned fin based devices on a silicon wafer according to embodiments described herein.

In accordance with one implementation, the integrated circuit die of the communication chip includes one or more devices, such as transistors and metal interconnects, as described herein. In various implementations, the computing device 2000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 2000 may be any other electronic device that processes data.

The following examples pertain to further embodiments:

A method to manufacture an electronic device comprises forming a first trench in an insulating layer to expose a native fin on a substrate; depositing a replacement fin on the native fin in the trench; and trimming the replacement fin laterally using a first chemistry.

A method to manufacture an electronic device comprises forming a first trench in an insulating layer to expose a native fin on a substrate; depositing a replacement fin on the native fin in the trench; and trimming the replacement fin laterally using a first chemistry, wherein trimming comprises adjusting the width of the replacement fin based on the width of the native fin.

A method to manufacture an electronic device comprises forming a first trench in an insulating layer to expose a native fin on a substrate; depositing a replacement fin on the native fin in the trench; and trimming the replacement fin laterally using a first chemistry, wherein the replacement fin is trimmed laterally using an isotropic etch.

A method to manufacture an electronic device comprises forming a first trench in an insulating layer to expose a native fin on a substrate; depositing a replacement fin on the native fin in the trench; and trimming the replacement fin laterally using a first chemistry, wherein the replacement fin is trimmed laterally using a plasma etch at a source power less than 2000 W.

A method to manufacture an electronic device comprises forming a first trench in an insulating layer to expose a native fin on a substrate; depositing a replacement fin on the native fin in the trench; and trimming the replacement fin laterally using a first chemistry, wherein the replacement fin is trimmed laterally using a remote plasma source.

A method to manufacture an electronic device comprises forming a first trench in an insulating layer to expose a native fin on a substrate; depositing a replacement fin on the native fin in the trench; and trimming the replacement fin laterally using a first chemistry, wherein the first chemistry comprises fluorine, chlorine, bromine, or any combination thereof.

A method to manufacture an electronic device comprises forming a first trench in an insulating layer to expose a native fin on a substrate; depositing a replacement fin on the native fin in the trench; and trimming the replacement fin laterally using a first chemistry, wherein the first chemistry comprises an ammonium hydroxide and water, wherein a ratio of water to the ammonium hydroxide is at least 1000:1.

A method to manufacture an electronic device comprises etching a first trench in the substrate to form a native fin; depositing an insulating layer into the first trench; forming a second trench in the insulating layer to expose the native fin; recessing the native fin; depositing a replacement fin on the recessed native fin in the second trench; and trimming the replacement fin laterally using a first chemistry.

A method to manufacture an electronic device comprises etching a first trench in the substrate to form a native fin; depositing an insulating layer into the first trench; forming a second trench in the insulating layer to expose the native fin; recessing the native fin; depositing a replacement fin on the recessed native fin in the second trench; and trimming the replacement fin laterally using a first chemistry, wherein the native fin is recessed to provide a non-faceted and a non-ion damaged interface with the replacement fin.

A method to manufacture an electronic device comprises etching a first trench in the substrate to form a native fin; depositing an insulating layer into the first trench; forming a second trench in the insulating layer to expose the native fin; recessing the native fin; depositing a replacement fin on the recessed native fin in the second trench; and trimming the replacement fin laterally using a first chemistry, wherein the concentration of the ammonium hydroxide in the water is not greater than 1%.

A method to manufacture an electronic device comprises etching a first trench in the substrate to form a native fin; depositing an insulating layer into the first trench; forming a second trench in the insulating layer to expose the native fin; recessing the native fin; depositing a replacement fin on the recessed native fin in the second trench; and trimming the replacement fin laterally using a first chemistry, wherein the native fin is recessed using a plasma etch at a plasma source power not greater than 1 kW.

A method to manufacture an electronic device comprises forming a first trench in an insulating layer to expose a native fin on a substrate; depositing a replacement fin on the native fin in the trench; and trimming the replacement fin laterally using a first chemistry, wherein a material of the replacement fin is different from a material of the native fin.

A method to manufacture an electronic device comprises forming a first trench in an insulating layer to expose a native fin on a substrate; depositing a replacement fin on the native fin in the trench; and trimming the replacement fin laterally using a first chemistry, wherein the replacement fin is selectively deposited on the native fin using an epitaxial growth technique.

A method to manufacture an electronic device comprises forming a first trench in an insulating layer to expose a native fin on a substrate; depositing a replacement fin on the native fin in the trench; and trimming the replacement fin laterally using a first chemistry, wherein the trimming is to reduce the replacement fin width to be narrower than or equal to the native fin width.

A method to manufacture an electronic device comprises forming a first trench in an insulating layer to expose a native fin on a substrate; depositing a replacement fin on the native fin in the trench; and trimming the replacement fin laterally using a first chemistry, wherein the replacement fin is a germanium fin, a silicon germanium fin, a germanium tin fin, or any combination thereof.

A method to manufacture an electronic device comprises forming a first trench in an insulating layer to expose a native fin on a substrate; depositing a replacement fin on the native fin in the trench; and trimming the replacement fin laterally using a first chemistry, wherein the replacement fin is a III-V material fin.

A method to manufacture an electronic device comprises forming a first trench in an insulating layer to expose a native fin on a substrate; depositing a replacement fin on the native fin in the trench; and trimming the replacement fin laterally using a first chemistry, wherein the native fin is a silicon fin.

A method to manufacture an electronic device comprises forming a first trench in an insulating layer to expose a native fin on a substrate; depositing a replacement fin on the native fin in the trench; and trimming the replacement fin laterally using a first chemistry, wherein an interface between the replacement fin and the native fin has a non-faceted morphology.

A method to manufacture an electronic device comprises forming a first trench in an insulating layer to expose a native fin on a substrate; depositing a replacement fin on the native fin in the trench; and trimming the replacement fin laterally using a first chemistry, wherein the trimmed replacement fin width is less than 5 nm.

A method to manufacture an electronic device comprises forming a first trench in an insulating layer to expose a native fin on a substrate; depositing a replacement fin on the native fin in the trench; and trimming the replacement fin laterally using a first chemistry; depositing a gate structure on the trimmed replacement fin; and forming source/drain regions at opposite sides of the gate structure.

A method to manufacture an electronic device comprises forming a plurality of native fins on a substrate, each native fin extending from the substrate; depositing an insulating layer on the plurality of native fins; recessing a first set of the native fins to provide a first set of trenches; depositing first replacement fins in the first set of trenches; recessing the insulating layer; and trimming the first replacement fins laterally.

A method to manufacture an electronic device comprises forming a plurality of native fins on a substrate, each native fin extending from the substrate; depositing an insulating layer on the plurality of native fins; recessing a first set of the native fins to provide a first set of trenches; depositing a first protection layer on a second set of the fins; depositing first replacement fins in the first set of trenches; recessing the insulating layer; and trimming the first replacement fins laterally.

A method to manufacture an electronic device comprises forming a plurality of native fins on a substrate, each native fin extending from the substrate; depositing an insulating layer on the plurality of native fins; recessing a first set of the native fins to provide a first set of trenches; depositing first replacement fins in the first set of trenches; recessing the insulating layer; trimming the first replacement fins laterally; recessing a second set of the native fins to provide a second set of trenches; depositing second replacement fins in the second set of trenches; and trimming the second replacement fins laterally.

A method to manufacture an electronic device comprises forming a plurality of native fins on a substrate, each native fin extending from the substrate; depositing an insulating layer on the plurality of native fins; recessing a first set of the native fins to provide a first set of trenches; depositing first replacement fins in the first set of trenches; recessing the insulating layer; and trimming the first replacement fins laterally; forming a gate structure on the trimmed first replacement fins; and forming source/drain regions at opposite sides of the gate structure.

A method to manufacture an electronic device comprises forming a plurality of native fins on a substrate, each native fin extending from the substrate; depositing an insulating layer on the plurality of native fins; recessing a first set of the native fins to provide a first set of trenches; depositing first replacement fins in the first set of trenches; recessing the insulating layer; and trimming the first replacement fins laterally, wherein trimming comprises adjusting the width of the replacement fins based on the width of the native fins.

A method to manufacture an electronic device comprises forming a plurality of native fins on a substrate, each native fin extending from the substrate; depositing an insulating layer on the plurality of native fins; recessing a first set of the native fins to provide a first set of trenches; depositing first replacement fins in the first set of trenches; recessing the insulating layer; and trimming the first replacement fins laterally, wherein the first replacement fins are trimmed laterally using an isotropic etch.

A method to manufacture an electronic device comprises forming a plurality of native fins on a substrate, each native fin extending from the substrate; depositing an insulating layer on the plurality of native fins; recessing a first set of the native fins to provide a first set of trenches; depositing first replacement fins in the first set of trenches; recessing the insulating layer; and trimming the first replacement fins laterally, wherein the first replacement fins are trimmed laterally using a plasma etch at a source power less than 2000 W.

A method to manufacture an electronic device comprises forming a plurality of native fins on a substrate, each native fin extending from the substrate; depositing an insulating layer on the plurality of native fins; recessing a first set of the native fins to provide a first set of trenches; depositing first replacement fins in the first set of trenches; recessing the insulating layer; and trimming the first replacement fins laterally, wherein the first replacement fins are trimmed laterally using a remote plasma source.

A method to manufacture an electronic device comprises forming a plurality of native fins on a substrate, each native fin extending from the substrate; depositing an insulating layer on the plurality of native fins; recessing a first set of the native fins to provide a first set of trenches; depositing first replacement fins in the first set of trenches; recessing the insulating layer; and trimming the first replacement fins laterally, wherein at least one of the first replacement fins is a germanium fin, a silicon germanium fin, a germanium tin fin, or any combination thereof.

A method to manufacture an electronic device comprises forming a plurality of native fins on a substrate, each native fin extending from the substrate; depositing an insulating layer on the plurality of native fins; recessing a first set of the native fins to provide a first set of trenches; depositing first replacement fins in the first set of trenches; recessing the insulating layer; and trimming the first replacement fins laterally, wherein at least one of the first replacement fins is a III-V material fin.

A method to manufacture an electronic device comprises forming a plurality of native fins on a substrate, each native fin extending from the substrate; depositing an insulating layer on the plurality of native fins; recessing a first set of the native fins to provide a first set of trenches; depositing first replacement fins in the first set of trenches; recessing the insulating layer; and trimming the first replacement fins laterally, wherein at least one of the native fins is a silicon fin.

An electronic device comprises a first trench in an insulating layer that exposes a native fin on a substrate; a replacement fin on the native fin in the trench, wherein the width of the replacement fin is narrower or equal to the width of the native fin.

An electronic device comprises a first trench in an insulating layer that exposes a native fin on a substrate; a replacement fin on the native fin in the trench, wherein the width of the replacement fin is narrower or equal to the width of the native fin, wherein an interface between the native fin and the replacement fin is substantially non-faceted.

An electronic device comprises a first trench in an insulating layer that exposes a native fin on a substrate; a replacement fin on the native fin in the trench, wherein the width of the replacement fin is narrower or equal to the width of the native fin, wherein an interface between the native fin and the replacement fin is substantially non-ion damaged.

An electronic device comprises a first trench in an insulating layer that exposes a native fin on a substrate; a replacement fin on the native fin in the trench, wherein the width of the replacement fin is narrower or equal to the width of the native fin, wherein a material of the replacement fin is different from a material of the native fin.

An electronic device comprises a first trench in an insulating layer that exposes a native fin on a substrate; a replacement fin on the native fin in the trench, wherein the width of the replacement fin is narrower or equal to the width of the native fin, wherein the replacement fin is a single crystal fin.

An electronic device comprises a first trench in an insulating layer that exposes a native fin on a substrate; a replacement fin on the native fin in the trench, wherein the width of the replacement fin is narrower or equal to the width of the native fin, wherein the replacement fin is a germanium fin, a silicon germanium fin, a germanium tin fin, or any combination thereof.

An electronic device comprises a first trench in an insulating layer that exposes a native fin on a substrate; a replacement fin on the native fin in the trench, wherein the width of the replacement fin is narrower or equal to the width of the native fin, wherein the replacement fin is a III-V material fin.

An electronic device comprises a first trench in an insulating layer that exposes a native fin on a substrate; a replacement fin on the native fin in the trench, wherein the width of the replacement fin is narrower or equal to the width of the native fin, wherein the native fin is a silicon fin.

An electronic device comprises a first trench in an insulating layer that exposes a native fin on a substrate; a replacement fin on the native fin in the trench, wherein the width of the replacement fin is narrower or equal to the width of the native fin, wherein the width of the replacement fin is less than 5 nm.

An electronic device comprises a first trench in an insulating layer that exposes a native fin on a substrate; a replacement fin on the native fin in the trench, wherein the width of the replacement fin is narrower or equal to the width of the native fin; a gate structure on the replacement fin; and source/drain regions at opposite sides of the gate structure.

An electronic device comprises a plurality of native fins on a substrate, each native fin extending from the substrate; an insulating layer on the plurality of native fins, wherein a first set of the native fins are recessed to provide a first set of trenches; first replacement fins on the first set of the native fins in the first set of trenches, wherein each first replacement fin has a width that is not greater than a width of the underlying native fin.

An electronic device comprises a plurality of native fins on a substrate, each native fin extending from the substrate; an insulating layer on the plurality of native fins, wherein a first set of the native fins are recessed to provide a first set of trenches; first replacement fins on the first set of the native fins in the first set of trenches, wherein each first replacement fin has a width that is not greater than a width of the underlying native fin; a second set of the native fins that are recessed to provide a second set of trenches; second replacement fins in the second set of trenches, wherein each second replacement fin has a width that is not greater than a width of the underlying native fin.

An electronic device comprises a plurality of native fins on a substrate, each native fin extending from the substrate; an insulating layer on the plurality of native fins, wherein a first set of the native fins are recessed to provide a first set of trenches; first replacement fins on the first set of the native fins in the first set of trenches, wherein each first replacement fin has a width that is not greater than a width of the underlying native fin; a gate structure on the first replacement fins; and source/drain regions at opposite sides of the gate structure.

An electronic device comprises a plurality of native fins on a substrate, each native fin extending from the substrate; an insulating layer on the plurality of native fins, wherein a first set of the native fins are recessed to provide a first set of trenches; first replacement fins on the first set of the native fins in the first set of trenches, wherein each first replacement fin has a width that is not greater than a width of the underlying native fin, wherein at least one of the first replacement fins is a germanium fin, a silicon germanium fin, a germanium tin fin, or any combination thereof.

An electronic device comprises a plurality of native fins on a substrate, each native fin extending from the substrate; an insulating layer on the plurality of native fins, wherein a first set of the native fins are recessed to provide a first set of trenches; first replacement fins on the first set of the native fins in the first set of trenches, wherein each first replacement fin has a width that is not greater than a width of the underlying native fin, wherein at least one of the first replacement fins is a III-V material fin.

An electronic device comprises a plurality of native fins on a substrate, each native fin extending from the substrate; an insulating layer on the plurality of native fins, wherein a first set of the native fins are recessed to provide a first set of trenches; first replacement fins on the first set of the native fins in the first set of trenches, wherein each first replacement fin has a width that is not greater than a width of the underlying native fin, wherein at least one of the native fins is a silicon fin.

What is claimed is:

1. A method to manufacture an electronic device comprising:
    forming a first trench in an insulating layer to expose a native fin on a substrate;
    depositing a replacement fin on the native fin in the trench; and
    trimming the replacement fin laterally using a first chemistry.

2. The method of claim 1, wherein trimming comprises adjusting the width of the replacement fin based on the width of the native fin.

3. The method of claim 1, wherein the replacement fin is trimmed laterally using an isotropic etch.

4. The method of claim 1, wherein the first chemistry comprises fluorine, chlorine, bromine, or any combination thereof.

5. The method of claim 1, wherein the first chemistry comprises an ammonium hydroxide and water, wherein a ratio of water to the ammonium hydroxide is at least 1000:1.

6. The method of claim 1, further comprising etching a second trench in the substrate to form the native fin; depositing the insulating layer into the second trench; and recessing the native fin to deposit the replacement fin.

7. The method of claim 1, wherein the trimming is to reduce the replacement fin width to be narrower than or equal to the native fin width.

8. A method to manufacture an electronic device comprising:
    forming a plurality of native fins on a substrate, each native fin extending from the substrate;
    depositing an insulating layer on the plurality of native fins;
    recessing a first set of the native fins to provide a first set of trenches;
    depositing first replacement fins in the first set of trenches;
    recessing the insulating layer; and
    trimming the first replacement fins laterally.

9. The method of claim 8, further comprising depositing a first protection layer on a second set of the fins.

10. The method of claim 8, further comprising recessing a second set of the native fins to provide a second set of trenches; depositing second replacement fins in the second set of trenches; and
    trimming the second replacement fins laterally.

11. The method of claim 8 wherein trimming comprises adjusting the width of the replacement fins based on the width of the native fins.

12. The method of claim 8, wherein the first replacement fins are trimmed laterally using an isotropic etch.

13. The method of claim 8, wherein the first replacement fins are trimmed laterally using at least one of a plasma etch at a source power less than 2000 W, or a remote plasma source.

14. The method of claim 8, wherein at least one of the first replacement fins is a germanium fin, a silicon germanium fin, a germanium tin fin, a III-V material fin, or any combination thereof.

15. An electronic device, comprising:
    a first trench in an insulating layer that exposes a native fin on a substrate;
    a replacement fin on the native fin in the trench, wherein the width of the replacement fin is narrower than the width of the native fin.

16. The electronic device of claim 15, wherein an interface between the native fin and the replacement fin is substantially flat.

17. The electronic device of claim 15, wherein the replacement fin is a germanium fin, a silicon germanium fin, a germanium tin fin, a III-V material fin, or any combination thereof.

18. The electronic device of claim 15, wherein the native fin is a silicon fin.

19. The electronic device of claim 15, wherein the width of the replacement fin is less than 5 nm.

20. The electronic device of claim 15, further comprising a gate structure on the replacement fin; and
    source/drain regions at opposite sides of the gate structure.

21. An electronic device, comprising:
    a first trench in an insulating layer that exposes a native fin on a substrate;
    a replacement fin on the native fin in the trench, wherein the width of the replacement fin is narrower or equal to the width of the native fin, and wherein the width of the replacement fin is less than 5 nm.

* * * * *